United States Patent
Wang et al.

(10) Patent No.: US 12,321,099 B2
(45) Date of Patent: Jun. 3, 2025

(54) METHOD FOR GENERATING EUV RADIATION

(71) Applicant: TAIWAN SEMICONDUCTOR MANUFACTURING COMPANY, LTD., Hsinchu (TW)

(72) Inventors: Sheng-Min Wang, New Taipei (TW); Shih-Ming Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 96 days.

(21) Appl. No.: 17/461,302

(22) Filed: Aug. 30, 2021

(65) Prior Publication Data

US 2023/0064760 A1 Mar. 2, 2023

(51) Int. Cl.
*G03F 7/00* (2006.01)
*G02B 5/08* (2006.01)

(52) U.S. Cl.
CPC ......... *G03F 7/7015* (2013.01); *G02B 5/0891* (2013.01); *G03F 7/70033* (2013.01);
(Continued)

(58) Field of Classification Search
CPC ............... G03F 7/7015; G03F 7/70033; G03F 7/70958; G03F 7/70983; G03F 7/70; G03F 7/70058; G03F 7/70141; G03F 7/70133; G03F 7/70191; G03F 7/702; G03F 7/70216; G03F 7/70233; G03F 7/70258; G03F 7/70266; G03F 7/70308; G03F 7/70316; G03F 7/70483–70533; G03F 7/7055; G03F 7/70566; G03F 7/70583; G03F 7/70591; G03F 7/706; G03F 7/70783; G03F 7/708; G03F 7/70858; G03F 7/70883; G03F 7/70891; G03F 7/7095; G03F 7/70966; G03F 7/70975; G02B 5/08; G02B 5/0816–0891; G21K 1/06; G21K 1/062;
(Continued)

(56) References Cited

U.S. PATENT DOCUMENTS 5,299,054 A * 3/1994 Geiger ................. G02B 6/2766
359/320
6,469,822 B1 * 10/2002 Zhu ......................... G02F 1/292
359/578
(Continued)

FOREIGN PATENT DOCUMENTS

WO WO-2022087307 A1 * 4/2022

*Primary Examiner* — Christina A Riddle
(74) *Attorney, Agent, or Firm* — STUDEBAKER BRACKETT PLLC

(57) ABSTRACT

A mirror structure includes an insulator layer and a first conductive layer disposed on the insulator layer. The first conductive layer includes a first non-conductive film disposed on the insulator layer. The first non-conductive film includes one or more first conductive segments. The mirror structure also includes a reflective layer disposed on the first conductive layer and an electro optical layer disposed on the reflective layer. The mirror structure further includes a second conductive layer disposed on the electro optical layer. The second conductive layer includes a second non-conductive film disposed on the electro optical layer. The second non-conductive film includes one or more second conductive segments.

20 Claims, 15 Drawing Sheets

(52) U.S. Cl.
CPC ...... *G03F 7/70266* (2013.01); *G03F 7/70316* (2013.01); *G03F 7/706* (2013.01); *G03F 7/70958* (2013.01)

(58) Field of Classification Search
CPC .......... G21K 1/067; G21K 1/08; G21K 1/087; G02F 1/03; G02F 1/0305; G02F 1/0322; G02F 1/07–076; G02F 1/133553; G02F 1/0154; H01S 3/107
USPC ........... 355/30, 52–55, 67–77; 359/359, 360, 359/237, 245–279
See application file for complete search history.

(56) References Cited

U.S. PATENT DOCUMENTS

| | | | |
|---|---|---|---|
| 6,542,214 B1* | 4/2003 | Hoshino | G02F 1/133553 349/149 |
| 6,643,054 B1* | 11/2003 | Weidlich | G02F 1/21 359/260 |
| 9,760,019 B2* | 9/2017 | Bittner | G03F 7/70191 |
| 2003/0151791 A1* | 8/2003 | Otagiri | G02F 1/133555 359/245 |
| 2006/0121375 A1* | 6/2006 | Tsacoyeanes | G03F 7/70191 430/30 |
| 2007/0171504 A1* | 7/2007 | Fujimori | G02F 1/055 359/245 |
| 2008/0285001 A1* | 11/2008 | Schneider | G03F 7/70116 430/5 |
| 2013/0034323 A1* | 2/2013 | Costache | G02F 1/313 385/8 |
| 2013/0176545 A1* | 7/2013 | Ehm | G21K 1/062 355/67 |
| 2018/0188562 A1* | 7/2018 | Jin | G02F 1/13306 |
| 2020/0278295 A1* | 9/2020 | Hansen | G03F 7/70141 |
| 2020/0326606 A1* | 10/2020 | Ataei | G02B 27/10 |

* cited by examiner

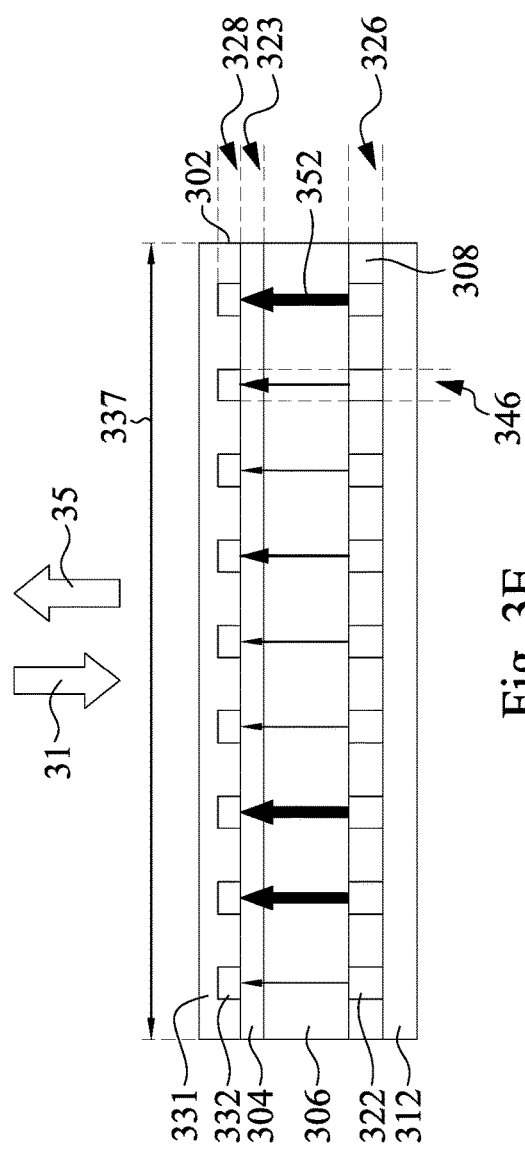
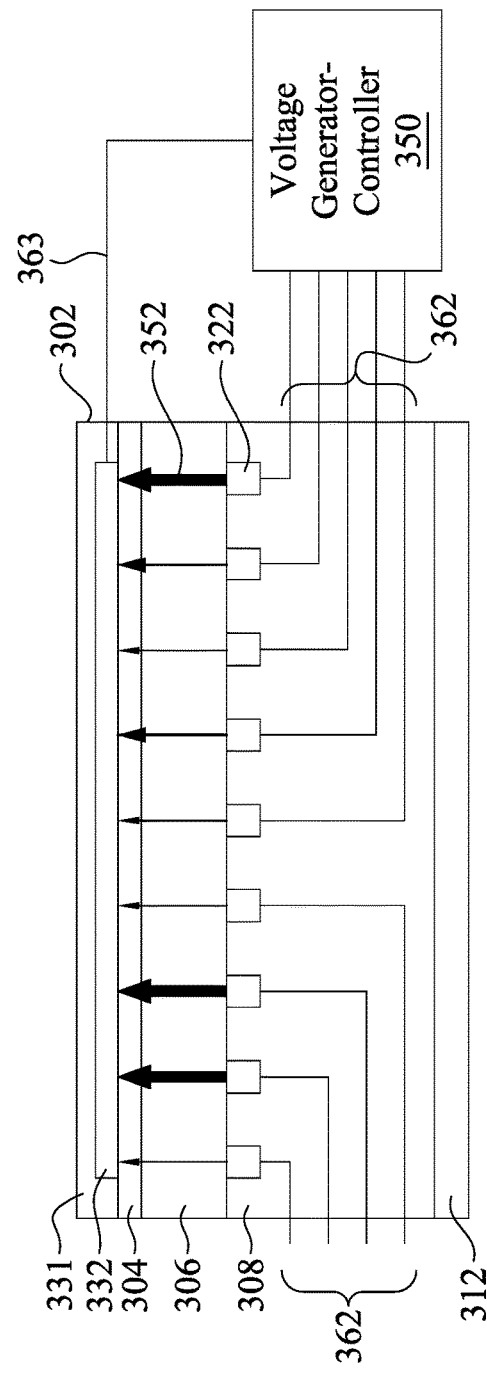

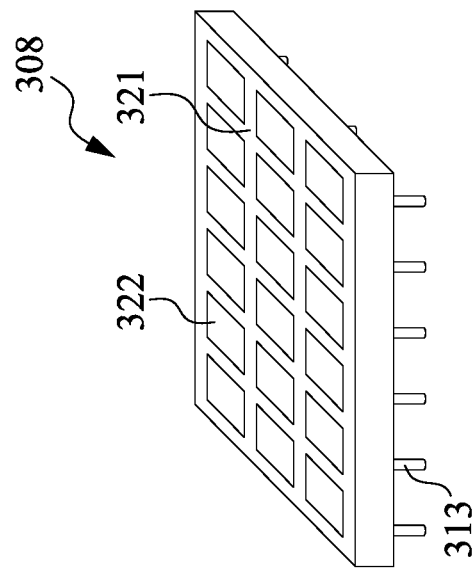
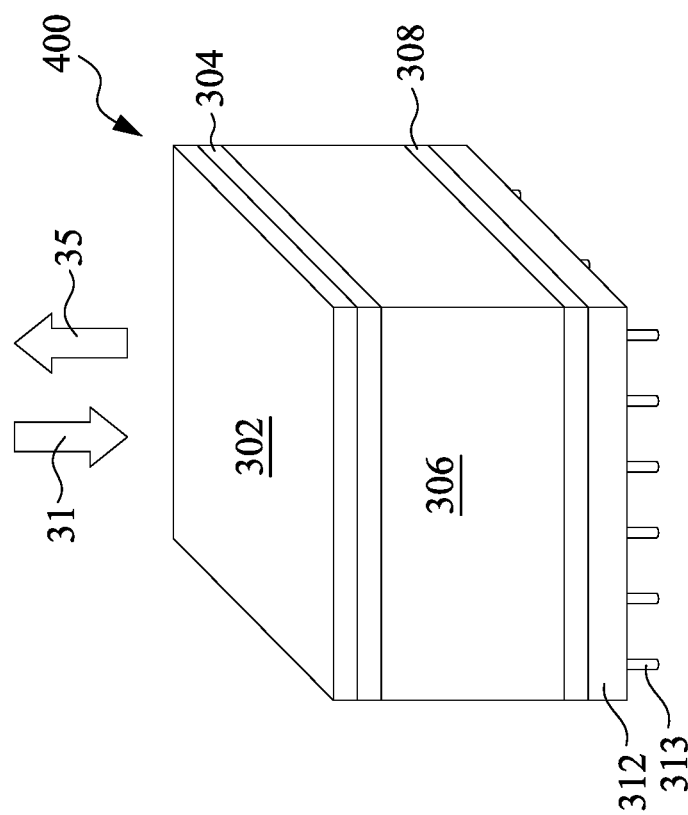
Fig. 4A
Fig. 4B

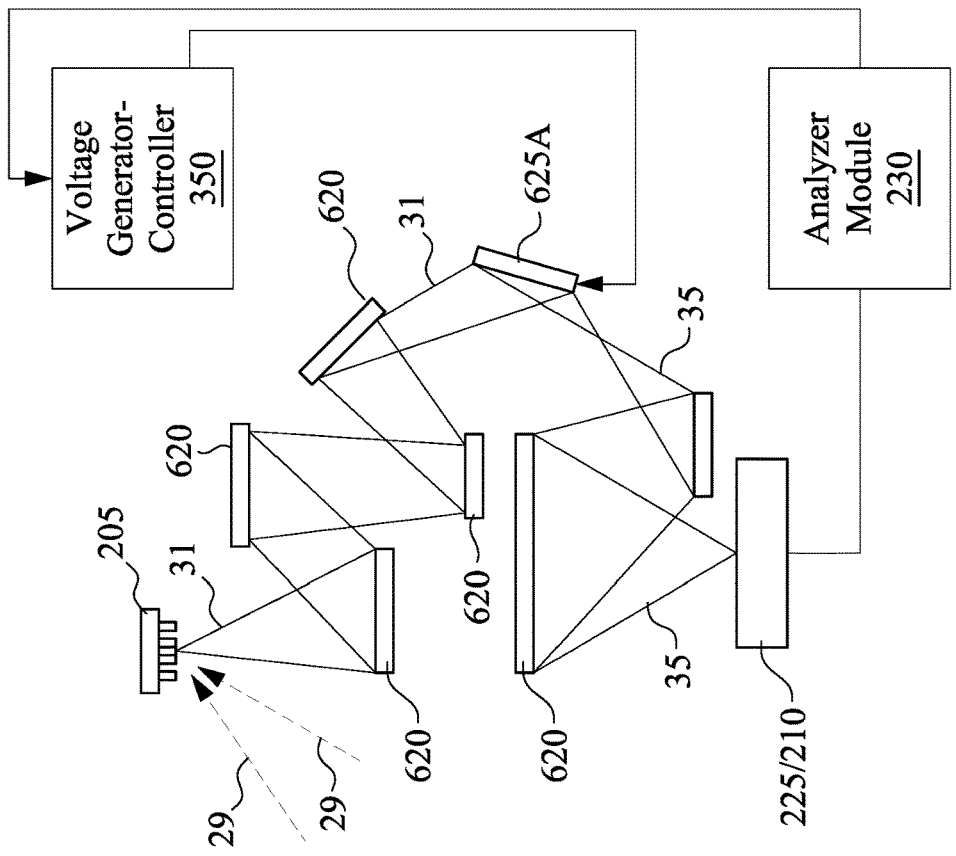
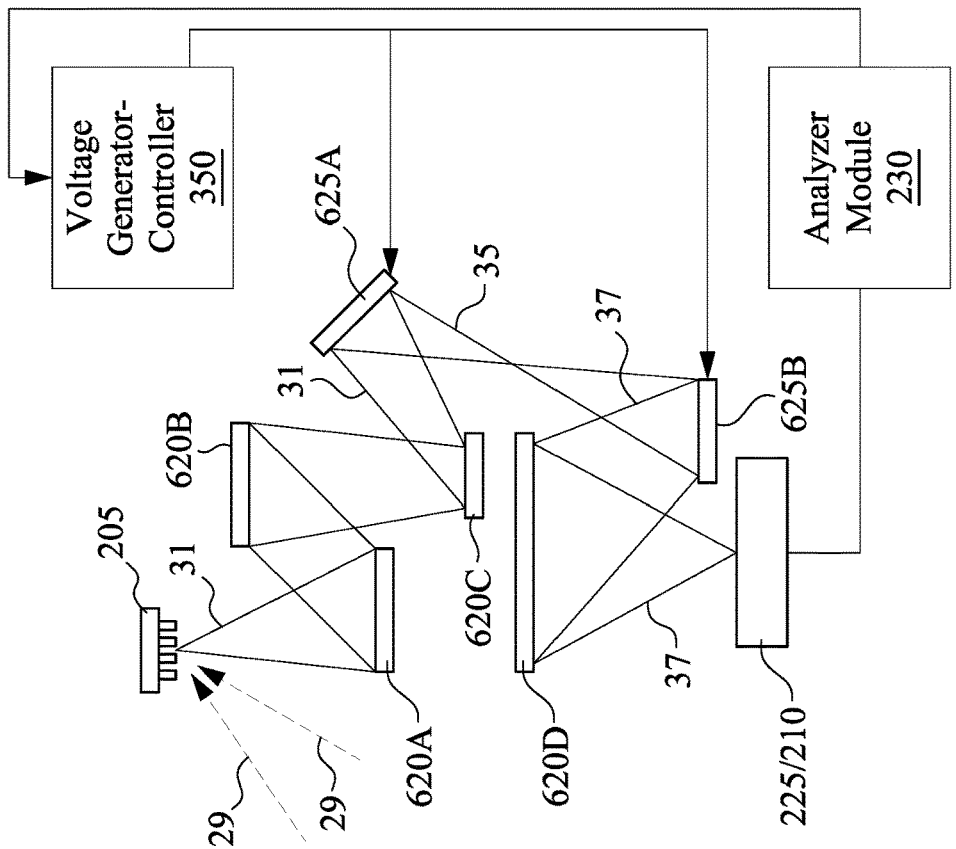
Fig. 7B
Fig. 7A

METHOD FOR GENERATING EUV RADIATION

BACKGROUND

During an integrated circuit (IC) design, a number of patterns of the IC, for different steps of IC processing, are generated on a substrate, e.g., a wafer. The patterns may be produced by projecting, e.g., imaging, layout patterns of a photo mask on a photo resist layer of the substrate. A lithographic process transfers the layout patterns of the photo masks to the photo resist layer of the substrate such that etching, implantation, or other steps are applied only to predefined regions of the substrate. The projection of the photo mask is performed by a radiation beam, e.g., an extreme ultraviolet (EUV) radiation beam, of a radiation source, e.g., an EUV radiation source, through an exposure device. The radiation source and the exposure device may produce optical aberration. The optical aberration may cause non-uniformity in the critical dimension (CD) and an overly measurement pattern of the resist pattern generated on the wafer. The non-uniformity in the overly measurement pattern may cause pattern placement error (PPE) between the resist pattern and the patterns of a lower layer. It is desirable to use a method and system that compensates the optical aberration of the lithographic system and improves CD and reduces PPE.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E, and 3F show electro optical devices and components of the electro optical device of an exposure device of a lithographic system in accordance with some embodiments of the present disclosure.

FIGS. 4A, 4B, and 4C show electro optical devices and components of the electro optical device of an exposure device of a lithographic system in accordance with some embodiments of the present disclosure.

FIGS. 7A, 7B, 7C, and 7D show exposure devices and cross-sectional views of mirrors of the exposure devices of a lithographic system in accordance with some embodiments of the present disclosure.

DETAILED DESCRIPTION

Figure 1:
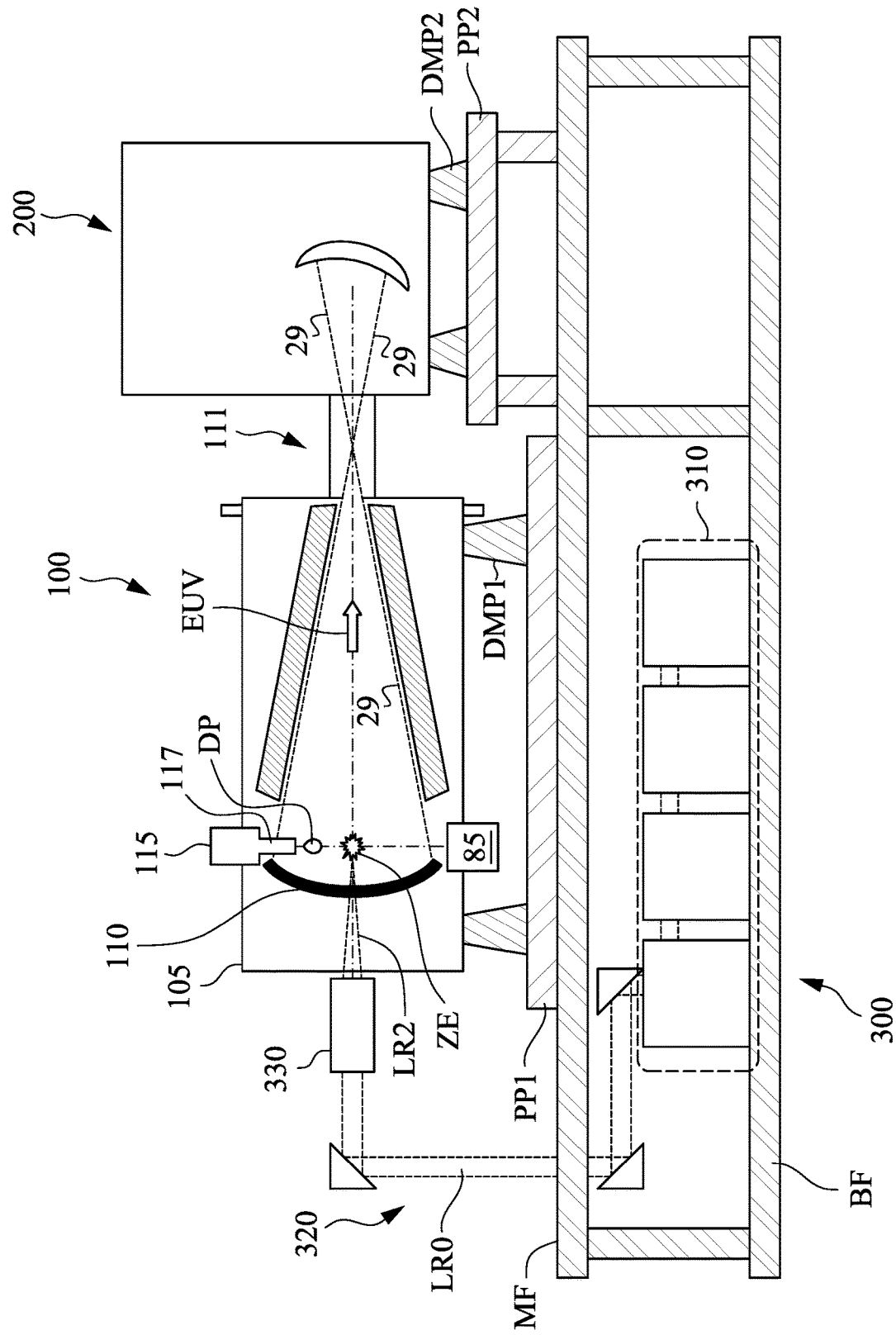
FIG. 1 shows a schematic view of an EUV lithography system with a laser produced plasma (LPP) EUV radiation source.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, the extreme ultraviolet (EUV) radiation produced by an EUV radiation source experiences optical aberration (e.g., phase and amplitude deformation) in EUV radiation source because of the imperfection of one or more components, e.g., imperfection of a collector mirror, of the EUV radiation source or because of uneven distribution of heat on the components of the EUV radiation source. In addition, the EUV radiation experiences optical aberration because of the imperfections of the components of the exposure device that uses the EUV radiation to project the layout patterns of a photo mask onto a wafer. The optical aberration causes image degradation when the layout patterns of the photo mask is projected on the wafer to produce the resist patterns on the wafer. The optical aberration may also degrade the CD and increase the PPE for the resist patterns generated on the wafer. In some embodiments, the lithography system uses a radiation source, e.g., a light source, that has a wavelength in the ultraviolet (UV) wavelength range between about 300 nm and about 400 nm, in the deep UV (DUV) wavelength range between about 150 nm and about 290 nm, in the EUV wavelength range between about 1 nm and about 100 nm, or in another wavelength range useful for lithography. The systems and methods discussed below may be applied the lithography system using a light source having a wavelength in the above wavelength ranges.

In some embodiments, mirrors such as convex, concave, and flat mirrors are used in the exposure device for directing the EUV radiation to the photo mask and also for projecting the reflected EUV radiation from the photo mask to a wafer. In some embodiments, in at least one of the mirrors, an electro optical layer is disposed at the back of the mirror in front of a reflective one or more layers of the mirror such that the EUV impinging on the mirror passes through a thickness of an electro optical layer, reflects back from the reflective one or more layers of the mirror, and passes again through the thickness of the electro optical layer. Thus, the EUV radiation that reflects back from the mirror passes twice through the thickness of the electro optical layer.

In some embodiments, the electro optical layer is sensitive to the applied electric field that is applied across the thickness of the electro optical layer. In some embodiments, the electro optical layer displays the Pockels effect such that the refractive index of the electro optical layer changes proportionally with the electric field. Thus, if an electric field is applied at a first location across the thickness of the electro optical layer, the refractive index of the electro optical layer across that thickness is modified proportional to the applied electric field. When the refractive index of the electro optical layer is modified at the first location across the thickness of the electro optical layer because of the applied electric field, the phase delay of the EUV radiation that passes at the first location across the thickness of the electro optical layer is modified compared to a time the same EUV radiation passes at the first location across the thickness of the electro optical layer when no electric field is applied.

In some embodiments, the electro optical layer is sandwiched between an anode layer that is coupled to a reflective one or more layers of the mirror attached to a first side of the electro optical layer, and a cathode layer attached a second surface of the electro optical layer opposite the first side of the electro optical layer. In some embodiments, the electric field is applied between the anode layer and the cathode layer. In some embodiments, multiple voltages are applied to a plurality of connection points on the anode layer and across the thickness of the electro optical layer to the cathode layer that is grounded. Thus, different electric fields are applied between the plurality of connection points of the anode layer and the cathode layer and multiple refractive index changes are produced across the electro optical layer at the multiple locations of the plurality of connection points and multiple phase changes are observed at the multiple locations across the electro optical layer.

In some embodiments, the electro optical layer displays the Kerr effect such that the refractive index of the electro optical layer changes proportionally with the squared value of the electric field. Thus, if an electric field is applied at a first location across the thickness of the electro optical layer, the refractive index of the electro optical layer across that thickness is modified proportional to the square value of the applied electric field. Therefore, when the electro optical layer is sensitive to either of the Pockels effect or Kerr effect, the electro optical layer may display different refractive index changes between the plurality of connection points on the anode, across the thickness of the electro optical layer, to the cathode layer. In some embodiments, by applying multiple voltages across the thickness of the electro optical layer, multiple refractive indices are generated at multiple locations in front of the mirror. Thus, the EUV radiation reflected from the mirror experiences multiple phases at the multiple locations. In some embodiments, the multiple phases at the multiple locations are controlled and selected such that the optical aberration of the lithographic system is reduced, e.g., is minimized. In some embodiments, the multiple refractive indices at multiple locations in front of the mirrors modify the phase and/or amplitude of the reflected EUV radiation from the one or more mirrors.

FIG. 1 shows a schematic view of an EUV lithography system with a laser produced plasma (LPP) EUV radiation source. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit 111. In some embodiments, a lithography system includes the EUV radiation source 100 and the exposure device 200.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 50 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optical components, such as convex/concave/flat mirrors, a mask holding mechanism including a mask stage, and wafer holding mechanism, e.g., a substrate holding mechanism or a wafer stage. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss. As noted, the exposure device 200 is maintained under a vacuum environment and the reticle is mounted over a substrate, with a photo resist layer disposed on the substrate. The EUV radiation generated by the EUV radiation source 100 is directed by the optical components to project the mask on the photo resist layer of the substrate.

In the present disclosure, the terms mask, photomask, and reticle are used interchangeably. In addition, the term resist and photoresist are used interchangeably. In some embodiments, the mask is a reflective mask. In some embodiments, the mask includes a substrate with a suitable material, such as a low thermal expansion material or fused quartz. In various examples, the material includes $TiO_2$ doped $SiO_2$, or other suitable material with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC).

The exposure device 200 includes a projection optics modules for imaging the pattern of the mask on to a semiconductor substrate with a resist coated thereon secured on a substrate stage of the exposure device 200. The projection optics modules generally includes reflective optics. The EUV radiation (EUV light) directed from the mask, carrying the image of the pattern defined on the mask, is collected and directed by the projection optics modules, e.g., mirrors, thereby forming an image on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes. The lithography system may further include other modules or be integrated with (or be coupled with) other modules.

As shown in FIG. 1, the EUV radiation source 100 includes a droplet generator 115 and a LPP collector mirror 110, enclosed by a chamber 105. The droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE (e.g., a target droplet location) at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 300 is a pulsed beam. The laser pulses of laser beam LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser source 300 has a wavelength of 9.4 μm or 10.6 μm in an embodiment. The laser light beam LR0 generated by the excitation laser source 300 is guided by the laser guide optics 320 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser. In some embodiments, a non-ionizing laser beam LR1 (not shown) is also generated by the excitation laser source 300 and the laser beam LR1 is also focused by the focusing apparatus 330 to pre-heat a given target droplet by generating a pre-heat laser pulse.

In some embodiments, the excitation laser beam LR2 includes the pre-heat laser pulse and a main laser pulse. In such embodiments, the pre-heat laser pulse (interchangeably referred to herein as the "pre-pulse) is used to heat (or pre-heat) the given target droplet to create a low-density target plume with multiple smaller droplets, which is subsequently heated (or reheated) by the main laser pulse from the main laser, to generate increased emission of EUV light compared to when the pre-heat laser pulse is not used.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation beam 29, which is collected by the collector mirror 110. The collector mirror 110, an EUV collector mirror, further reflects and focuses the EUV radiation beam 29 for the lithography exposing processes performed through the exposure device 200. A droplet DP that does not interact with the laser pulses is captured by the droplet catcher 85. As shown in FIG. 1, the EUV radiation beam 29 from the collector mirror 110 focuses at the focusing unit 111 between EUV radiation source 100 and the exposure device 200. The EUV radiation beam 29 that enters from the focusing unit 111 into the exposure device 200 is consistent with EUV radiation that is originated from the focused point, e.g., a point source, in the focusing unit 111.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as $$v_{dp}=d/(t_{rad}-t_o) \qquad \text{equation (1)}.$$

Because the droplet generator 115 is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, because the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized.

Figure 2A:
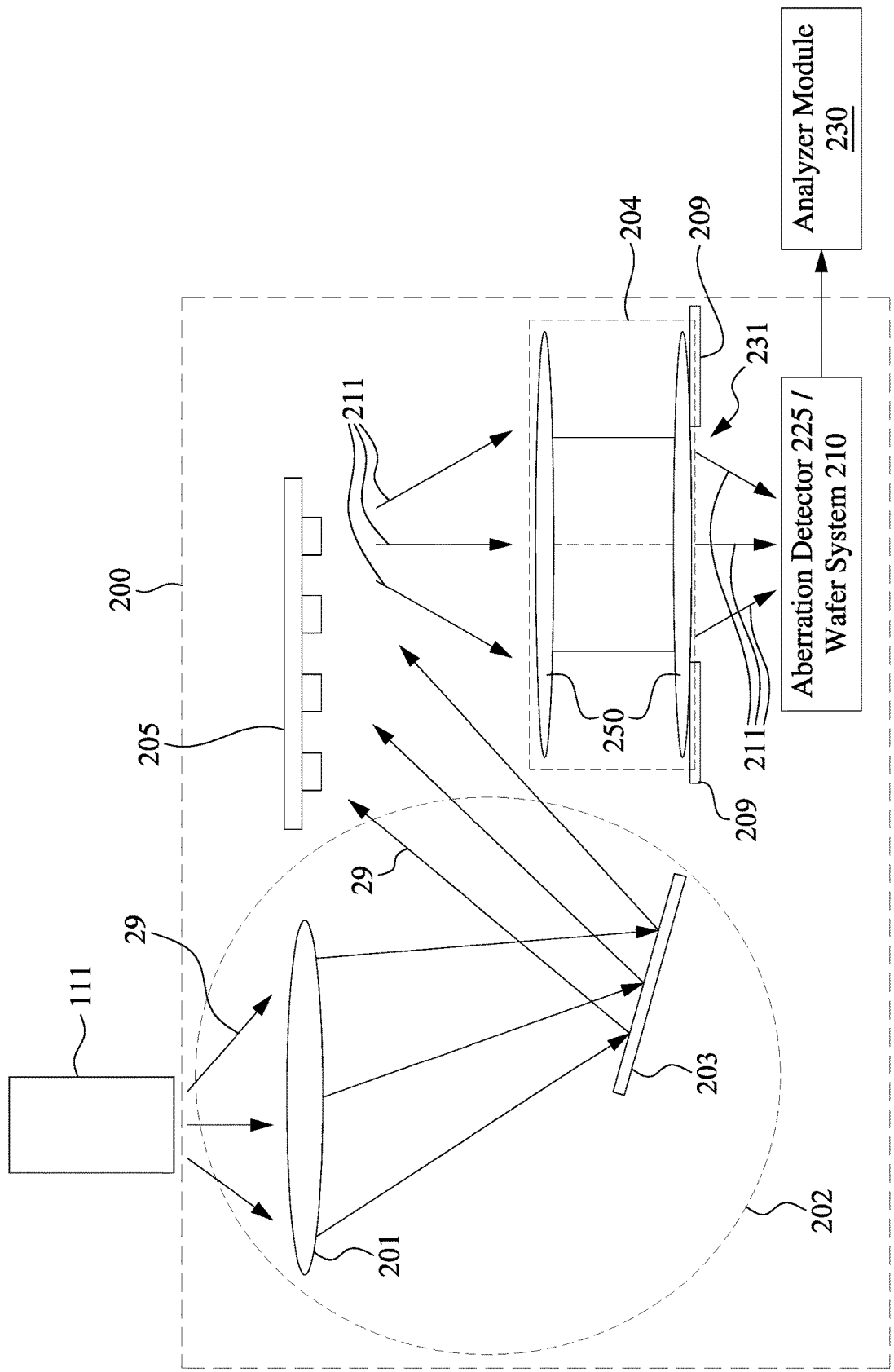
FIGS. 2A and 2B show an exposure device of a lithographic system and the lithographic system.
Figure 2B:
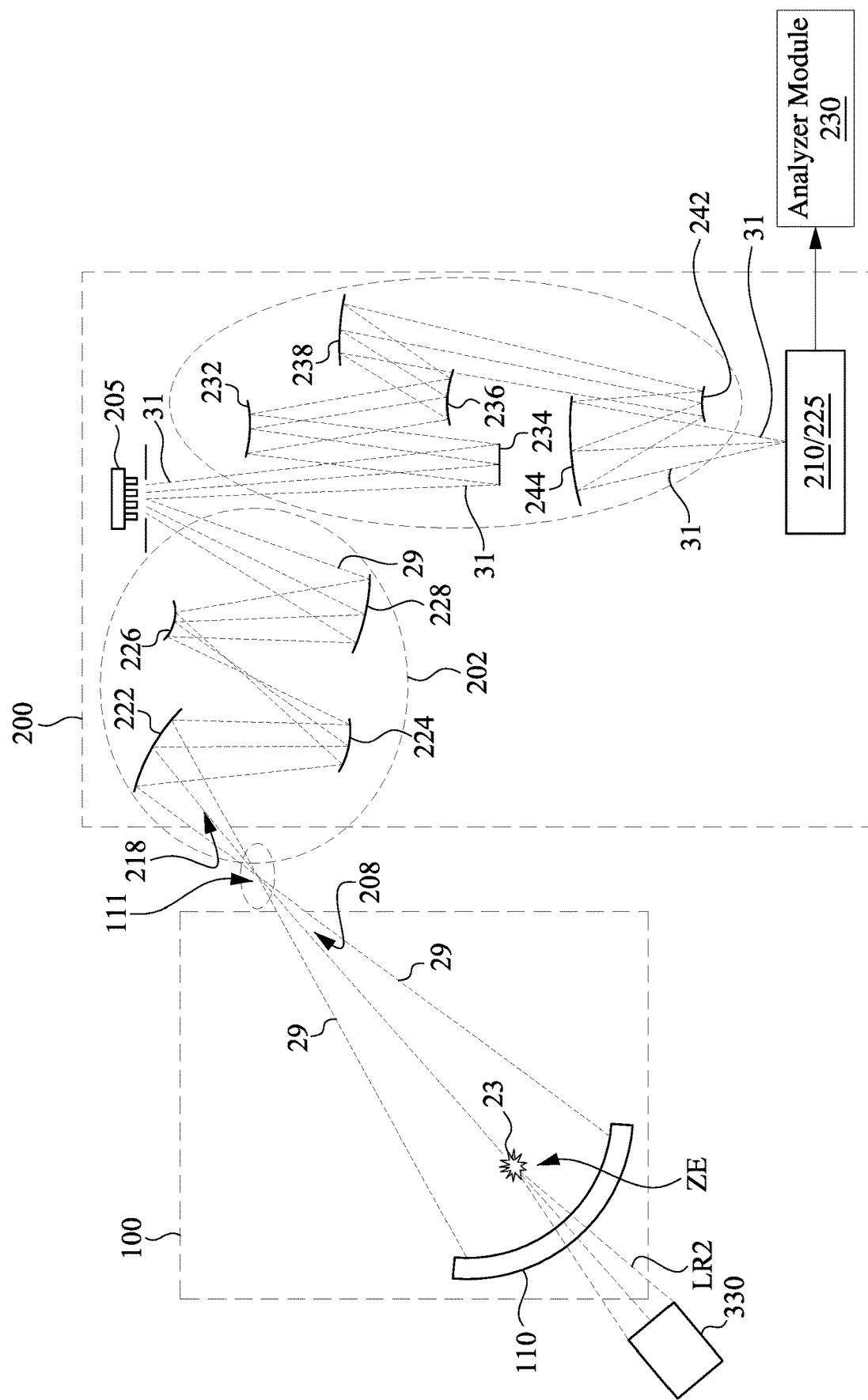

FIGS. 2A and 2B show an exposure device of a lithographic system and the lithographic system. As shown in FIG. 2A, the exposure device 200 receives the EUV radiation beam 29 from the focusing unit 111. The exposure device 200 includes illumination optics 202, including a lens 201 and a flat mirror 203, for directing the EUV radiation beam 29 to impinge on a photo mask 205 to illuminate layout patterns of photo mask 205. In some embodiments, the photo mask 205 is a reflective photo mask and EUV radiation 211 is reflected back from the layout patterns of the photo mask 205. The EUV radiation 211 reflected from the photo mask 205 is imaged by projection optics 204 onto a wafer system 210. In some embodiments, the EUV radiation 211 is imaged on the wafer system 210, which includes a wafer, e.g., a substrate, mounted on a wafer stage. In some embodiments, the EUV radiation 211 is imaged on a photo resist layer disposed on top of the substrate to generate a resist pattern on the substrate. FIG. 2A also shows an exit pupil 231 of the exposure device 200 that is defined by opaque barriers 209.

In some embodiments, the EUV radiation 211 is imaged on an aberration detector 225. In some embodiments, the aberration detector 225 is an image detector that captures an image of the layout patterns of the photo mask 205. The aberration detector 225 is coupled to an analyzer module 230 that receives the captured image of the layout patterns of the photo mask 205. By inspecting the captured image of the layout patterns of the photo mask 205, the analyzer module 230 may determine the optical aberration of the illumination optics 202 and the optical aberration of the projection optics 204. In some embodiments, the optical aberration of the illumination optics 202 and/or the projection optics 204 is determined by inspecting the critical dimension (CD) uniformity of the captured image of the layout patterns of the photo mask 205. In some embodiments, the projection optics 204 includes converging lenses 250.

In some embodiments, the optical aberration of the exposure device 200, which is caused by the optical aberration of the illumination optics 202 and/or the optical aberration of the projection optics 204 is measured by a difference, e.g., percentage difference, between the measured CD uniformity of the captured image of the layout patterns of the photo mask 205 with a predetermined threshold CD uniformity. In some embodiments, the optical aberration causes pinching, e.g., breaking connection lines or other similar structures, in the captured image of the layout patterns. In some embodiments, the optical aberration causes bridging, e.g., connecting adjacent connection lines or other similar structures, in the captured image of the layout patterns. Thus, in some embodiments, the optical aberration of the exposure device 200 is measured by the number of pinching and bridging in captured image of the layout patterns.

The EUV lithography system of FIG. 2B includes the EUV radiation source 100 that produces the beam of EUV radiation beam 29 by using the focusing apparatus 330 to focus the laser beam LR2 at the zone of excitation ZE to generate the plasma plume 23. Part of the EUV radiation generated by the plasma plume is the EUV radiation beam 29 that impinges on the collector mirror 110 and reflected from the collector mirror 110 and passes through the focusing unit 111 outside EUV radiation source 100 after exiting the EUV radiation source 100 through an aperture 208 of the EUV radiation source 100. In some embodiments, the aperture 208 is made of a material transparent to EUV radiation.

The EUV lithography system of FIG. 2B also includes the exposure device 200. The exposure device includes a plurality of convex, concave, or flat mirrors. As shown, the EUV radiation beam 29 is focused by the focusing unit 111 between the EUV radiation source 100 and the exposure device 200 and then enters the exposure device 200 through an aperture 218 of the exposure device 200 and the aperture 218 is made of a material transparent to EUV radiation, After entering the exposure device 200, the EUV radiation beam 29 is directed by illumination optics 202 to the photo mask 205. As shown, the EUV radiation beam 29 is directed to a converging mirror 222 of the illumination optics 202 and reflects from the converging mirror 222, is directed to another converging mirror 224 of the illumination optics 202 and reflects from the converging mirror 224, is directed to a diverging mirror 226 of the illumination optics 202 and reflects from the diverging mirror 226, and is directed a flat mirror 228 of the illumination optics 202 and reflects from the flat mirror 228 to impinge on the photo mask 205, e.g., a reflective photo mask. The EUV radiation beam 31 is reflected from the layout patterns of the photo mask 205.

After reflecting from the layout patterns of the photo mask 205, the EUV radiation beam 31 is directed by projection optics 204 to the wafer system 210 or the aberration detector 225. As shown, the EUV radiation beam 31 is directed to a flat mirror 234 of the projection optics 204 and reflects from the flat mirror 234, is directed to a diverging mirror 232 of the projection optics 204 and reflects from the diverging mirror 232, is directed to another diverging mirror 236 of the projection optics 204 and reflects from the diverging mirror 236, is directed to a converging mirror 238 of the projection optics 204 and reflects from the converging mirror 238, is directed to another diverging mirror 242 of the projection optics 204 and reflects from the diverging mirror 242, is directed to another converging mirror 244 of the projection optics 204 and reflects from the converging mirror 244 to impinge on the wafer system 210 or the aberration detector 225.

Figure 3B:
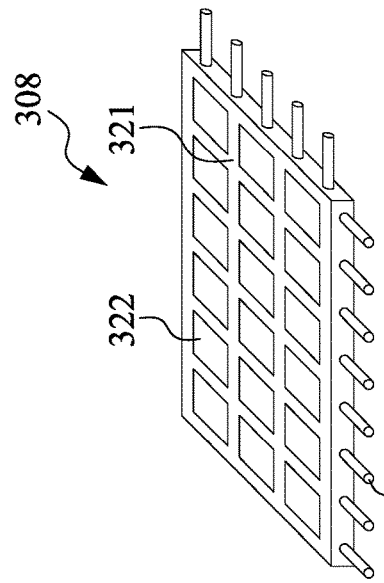
Figure 3D:
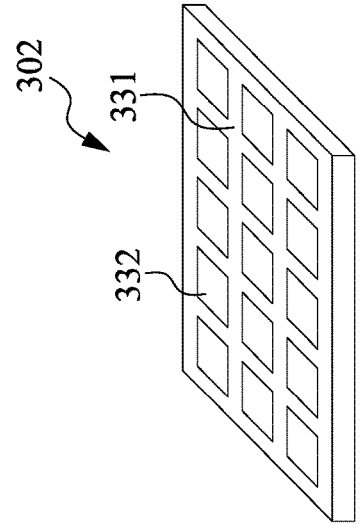
Figure 3A:
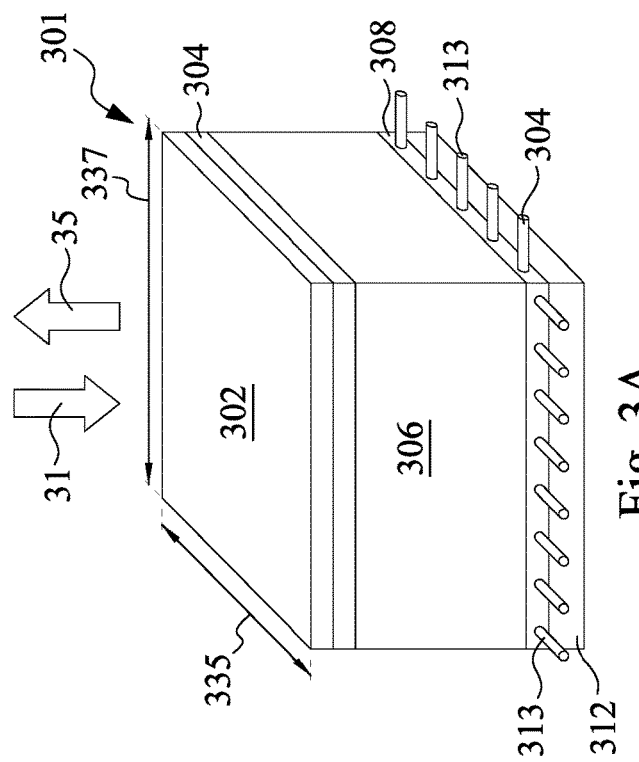

FIGS. 3A, 3B, 3C, 3D, 3E, and 3F show electro optical devices and components of the electro optical device of an exposure device of a lithographic system in accordance with some embodiments of the present disclosure. FIG. 3A shows an electro optical device 301 with a width 335 and a length 337 of a reflective surface of a reflective mirror. In some embodiments, the electro optical device 301 of FIG. 3A is included in one or more reflective mirrors 222, 224, 226, 228, 232, 234, 236, 238, 242, or 244 of FIG. 2B. The electro optical device 301 includes a first conductive layer 308 disposed over an insulator layer 312, multi reflective layers 306 disposed over the first conductive layer 308, an electro optical layer 304 disposed over the multi reflective layers 306, and a second conductive layer 302 disposed over the electro optical layer 304. FIG. 3B shows a top side the first conductive layer 308 that is in contact with the multi reflective layers 306 and includes a plurality of conductive segments 322 made of a conductive material, e.g., aluminum or copper, and a plurality of electrodes 313 made of a conductive material, e.g., aluminum or copper. Each conductive segment 322 is connected to an electrode 313 such that a separate voltage may be applied to each one of the plurality of conductive segments 322 through the plurality of electrodes 313. The plurality of conductive segments 322 of the first conductive layer 308 are electrically disconnected from each other by an insulation region 321 made of a non-conductive material, e.g., silicon dioxide. In some embodiments, a bottom side of the first conductive layer 308 that is in contact with the insulator layer 312 is made of the non-conductive material of the insulation region 321. In some embodiments, the first conductive layer 308 is produced by 1) disposing a layer made of the non-conductive material on the insulator layer 312, 2) etching the location of the conductive segments 322 in the non-conductive material while leaving the non-conductive material in the insulation region 321, and 3) disposing the conductive material in the etched location of the conductive segments 322 to produce a layer of conductive material in the conductive segments 322. In some embodiments, the conductive material of the conductive segments 322 includes or is made of one or more of the elements of a first group of elements Mo, Nb, Zr, Ru, or Ti which have a low extension coefficient and provide high EUV transmissivity. In some embodiments, the second conductive layer 302 is made of or includes one or more of the elements of a second group of elements Au, Cu, or Al which have a higher extension coefficient compared the first group. In some embodiments, the non-conductive material of the insulation region 321 includes or is made of silicon dioxide or amorphous silicon. In some embodiments, the insulator layer 312 includes or is made of glass, a composite polymer, or porcelain.

Figure 3C:
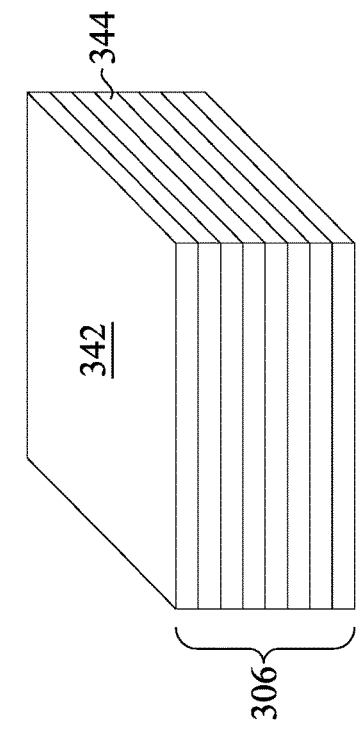

FIG. 3C shows the multi reflective layers 306 that includes a plurality of film pairs, e.g., alternating layers 342 and 344. The multi reflective layers 306 is configurable to highly reflect the EUV light. As described, in some embodiments, the alternating layers 342 and 344 include molybdenum-silicon (Mo/Si) film pairs such that, except for the top most and bottom most layers, each layer 342 is sandwiched between two layers 344 and each layer 344 is sandwiched between two layers 342. Alternatively, the layers 342 and 344 include molybdenum-beryllium (Mo/Be) film pairs, or other suitable materials. Thus, the multi reflective layers 306 is highly reflective to incident EUV radiation beam 31 and the incident EUV radiation beam 31 is reflected as reflected EUV radiation beam 35. FIG. 3D shows a bottom side of the second conductive layer 302 that is in contact with the electro optical layer 304 and includes a plurality of conductive segments 332 made of a conductive material, e.g., aluminum or copper. The plurality of conductive segments 332 are connected to each other and are connected to the same voltage, e.g., the ground. In some embodiments, the plurality of conductive segments 332 of the second conductive layer 302 are electrically disconnected from each other by an insulation region 331 made of a non-conductive material, e.g., silicon dioxide. In some embodiments, each conductive segment 332 of the second conductive layer 302 corresponds to and is disposed over a conductive segment 322 of the first conductive layer 308. In some embodiments the bottom side of the second conductive layer 302 is made of a connected conductive material and there is no insulation region 331 between the conductive segments 332. In some embodiments the top side of the second conductive layer 302 is made of the non-conductive material. In some embodiments, the second conductive layer 302 is produced by 1) disposing a layer made of the non-conductive material on the electro optical layer 304, 2) etching the location of the conductive segments 332 in the non-conductive material while leaving the non-conductive material in the insulation region 331, 3) disposing the conductive material in the etched location of the conductive segments 322, and 4) disposing the non-conductive material over the conductive segments 322 and the insulation region 331. In some embodiments, the conductive segments 322 are disposed on a top portion of the first conductive layer 308 and are at proximity, or in contact, with the multi reflective layers 306. In some embodiments, the conductive segments 332 are disposed on a bottom portion of the second conductive layer 302 and are at proximity, or in contact, with the electro optical layer 304. In some embodiments, the second conductive layer 302, including the conductive material and the non-conductive material of the second conductive layer 302 are essentially transparent to the incident EUV radiation beam 31.

In some embodiments, the electro optical layer 304 displays the Kerr effect such that the refractive index of the electro optical layer changes proportionally with the squared value of the electric field in the electro optical layer 304. Thus, if a voltage is applied across a thickness of the electro optical layer 304, the generated electric field, by the applied voltage, across the thickness of the electro optical layer, causes the refractive index of the electro optical layer across the thickness the electro optical layer 304 to be modified. If the electro optical layer 304 displays the Pockels effect, the refractive index of the electro optical layer changes proportionally with the electric field. In some embodiments, the electro optical layer 304 is sensitive to either of the Pockels effect or the Kerr effect and the electro optical layer 304 display different refractive index changes across the thickness the electro optical layer 304 when different voltages are applied across the thickness of the electro optical layer 304 at different locations. In some embodiments, the incident beam is not perpendicular to the surface of the mirror and, thus, the incident beam and the reflected beam pass different paths in the electro optical layer 304. Thus, absolute phase changes due to Pockels effect of the different paths may not be the same.

FIG. 3E shows a cross-sectional view of the electro optical device 301 of FIG. 3A. FIG. 3E shows the conductive segments 322 in the first conductive layer 308 and the conductive segments 332 in the second conductive layer 302. FIG. 3E also shows electric fields 352 applied between each two corresponding conductive segments 322 and conductive segments 332 that are caused by applying voltages between the conductive segments 322 and the conductive segments 332. The electric fields 352, e.g., represented by the arrows, are applied across the multi reflective layers 306 and the electro optical layer 304. As shown different voltages are applied between each two corresponding conductive segments 322 and conductive segments 332 and, thus, different electric fields 352 is applied between each two corresponding conductive segments 322 and conductive segments 332 and different electric fields 352 is applied along the thickness 323 of the electro optical layer 304. In some embodiments, a thickness of the arrows of the electric field 352 shows the strength of the electric field 352 with a thicker arrow representing a stronger electric field. Therefore, no matter the electro optical layer 304 is sensitive to either of the Pockels effect or the Kerr effect, at the location of the thicker arrows of the electric field 352 more refractive index change occurs across the thickness 323 of the electro optical layer 304 compared to the location of the thinner arrows of the electric field 352. As shown in FIG. 3E, if the applied voltage from conductive segment 322 to conductive segment 332 is positive, the arrow of the electric filed 352 starts from the conductive segment 322 and end at the conductive segment 332. In some embodiments, the electric field 352 are not only the straight arrows and some of the arrows of may have a curvature between the conductive segment 322 and the conductive segment 332 and go through the multi reflective layers 306 and the electro optical layer 304 along the entire length 337 and, thus, change the refractive index of the electro optical layer 304 along the entire length 337 and the entire width 335 of the electro optical layer 304. As shown in FIGS. 3A and 3E, the incident EUV radiation beam 31 enters the electro optical device 301 and is reflected as reflected EUV radiation beam 35. Thus, the EUV beam passes twice through the thickness 323 of the electro optical layer 304 and thus experiences different phase changes at different locations along the length 337 and the width 335 of the electro optical layer 304.

In some embodiments, the electro optical layer 304 includes LiNbO$_3$ to produce the Pockels effect. In some embodiments, the electro optical layer 304 includes silicon dioxide to produce the Kerr effect. In some embodiments, both a LiNbO$_3$ film and a silicon oxide film are used as the electro optical layer 304. In some embodiments, a thickness 328 of the conductive segments 332 is between about 0.1 nm and about 100 nm. In some embodiments, a thickness 326 of the conductive segments 322 is between about 0.1 nm and about 2 cm. In some embodiments, the number of conductive segments 322 is between 1 and 1,000,000 and a width 346 of the conductive segments 322 and 332 are between 50 nm and 1 cm. In some embodiments, the distance of the insulation regions 321 or 331 between respective adjacent conductive segments 322 and 332 in each direction is between 0.1 nm and 1,000 nm. In some embodiments, the root-meat-square of the imperfect wavefront produced by a mirror is about 0.3 nm. Thus, to produce the phase change to compensate the imperfect wavefront of about 0.3 nm using the Pockels effect, a voltage of about 5.9 kV is applied across the electro optical layer 304 that has a thickness of 3 nm and is made of LiNbO$_3$ when the EUV radiation source has a wavelength of about 13.5 nm. In some embodiments, a voltage of about 133 kV produces 180 degrees phase shift in the 3 nm thickness of the electro optical material that is made of LiNbO$_3$. In some embodiments, the refractive index of the electro optical layer 304 is made of or includes a material that is sensitive to electric field.

FIG. 3F shows a cross-sectional view of the electro optical device 301 of FIG. 3A. FIG. 3F is consistent with FIG. 3E. In addition to FIG. 3E, FIG. 3F shows a voltage generator-controller 350, e.g., a voltage controller coupled to a voltage source, that is coupled through a plurality of electrical connections 362 to the conductive segment 322 in the first conductive layer 308 of FIG. 3F and provides a plurality of voltages to the conductive segments 322. Also, the voltage generator-controller 350 is coupled through an electrical connection 363 to the conductive segment 332 of FIG. 3F. In some embodiments, the voltage generator-controller 350 provides multiple different voltages to the conductive segments 322 of FIG. 3F and provides a single voltage to the single conductive segments 332 of FIG. 3F. In some embodiments, FIG. 3E also includes the voltage generator-controller 350 similar to FIG. 3F and the voltage generator-controller 350 provides a single voltage or multiple different voltages to the conductive segments 332 of FIG. 3E. In some embodiments, the voltage generator-controller 350 provides the ground connection to the conductive segment(s) 332. In some embodiments, by applying the voltages, the voltage generator-controller 350 provides a positive electrical field from the conductive segments 322 of FIGS. 3E and 3F to the conductive segment(s) 332 of FIGS. 3E and 3F. The electric field passes through the multi reflective layers 306 and the electro optical layer 304 and generates a refractive index change in the electro optical layer 304.

Figure 4C:
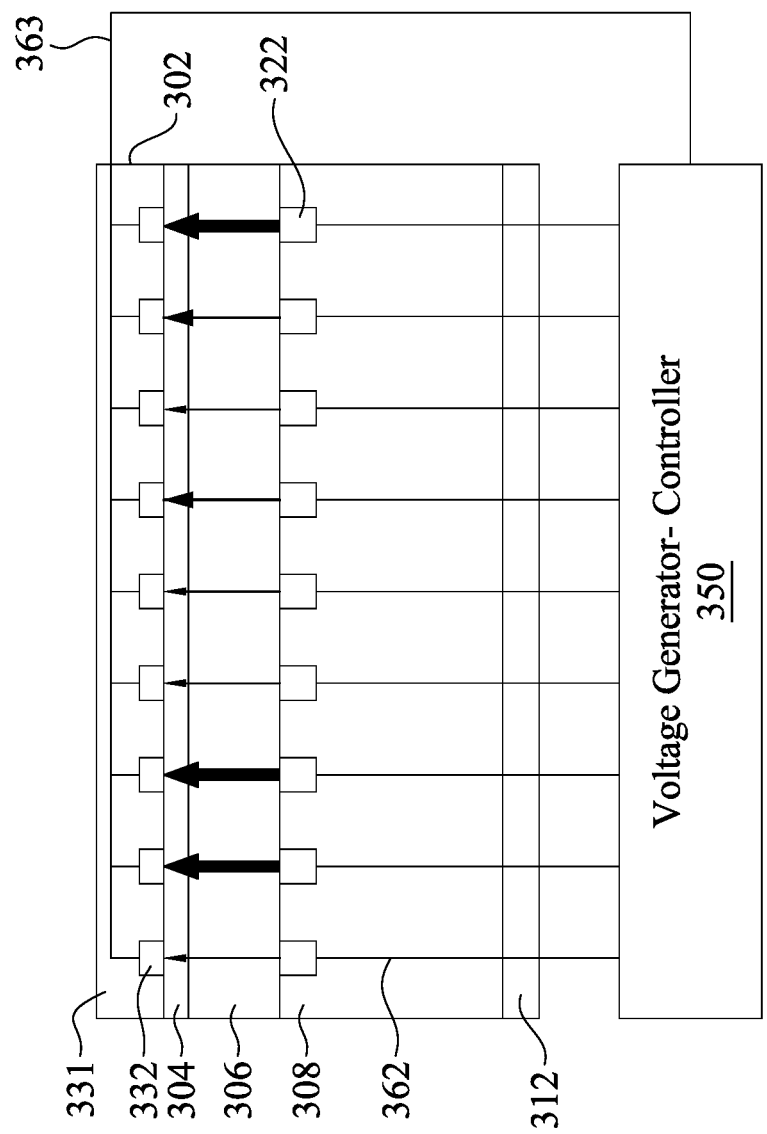

FIGS. 4A, 4B, and 4C show electro optical devices and components of the electro optical device of an exposure device of a lithographic system in accordance with some embodiments of the present disclosure. An electro optical device 400 of FIG. 4A is consistent with the electro optical device 301 of FIG. 3A with the difference that the electrodes 313 of the electro optical device 400 are vertically arranged. The first conductive layer 308 of FIG. 4B is consistent with the first conductive layer 308 of FIG. 3B with the difference that the electrodes 313 of first conductive layer 308 of FIG. 4B are vertically arranged but the electrodes 313 of first conductive layer 308 of FIG. 3B are horizontally arranged. FIG. 4C consistent with FIG. 3F shows a cross-sectional view of the electro optical device 400 of FIG. 4A. As shown in FIG. 4C, the plurality of electrical connections 362 to the conductive segment 322 in the first conductive layer 308 are vertically arranged. Also, the conductive segment 322 in the second conductive layer 302 are connected to each other and are connected via electrical connection 363 to the voltage generator-controller 350. In some embodiments, the electrical connection 363 is connected to the ground and the electrode connections 362 are connected to different positive voltages and thus the electrical field 352 has an upward direction from the conductive segment 322 to the conductive segments 332 and passes through the multi reflective layers 306 and the electro optical layer 304.

Figure 5B:
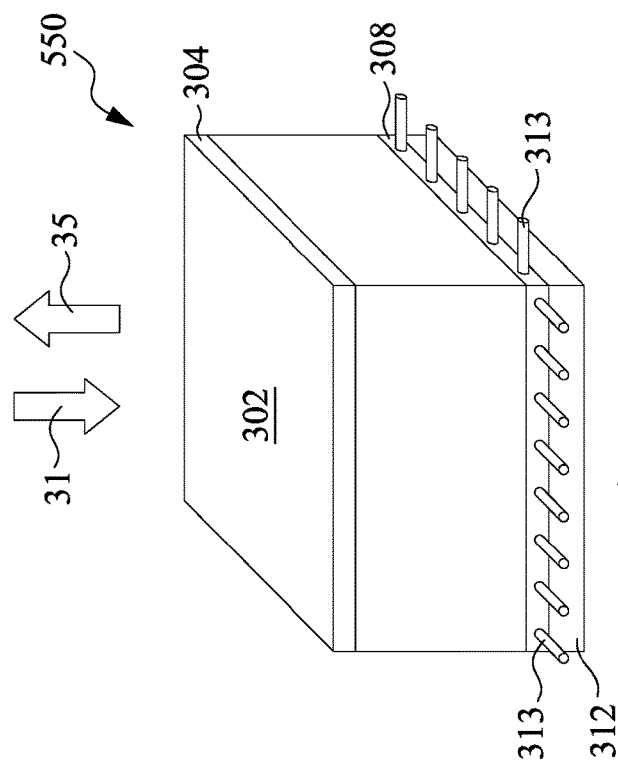
FIGS. 5A, 5B, and 5C show electro-optical devices and components of an exposure device of a lithographic system in accordance with some embodiments of the present disclosure.
Figure 5A:
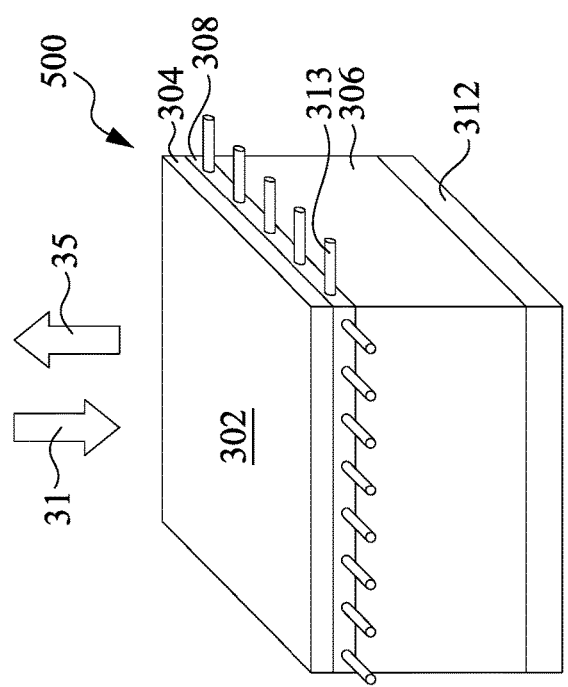
Figure 5C:
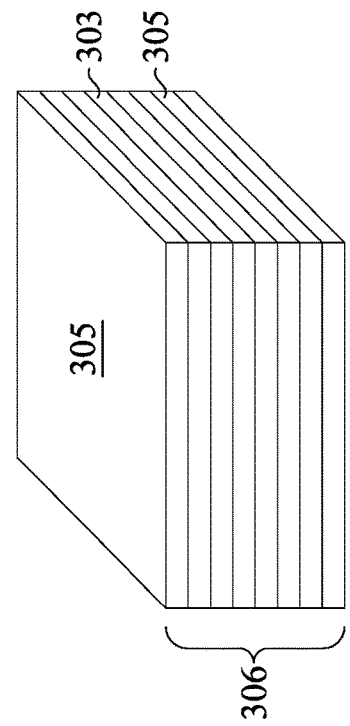

FIGS. 5A, 5B, and 5C show electro-optical devices and components of an exposure device of a lithographic system in accordance with some embodiments of the present disclosure. An electro optical device 500 of FIG. 5A is consistent with the electro optical device 301 of FIG. 3A with the difference that the first conductive layer 308 of the electro optical device 500 is disposed between the multi reflective layers 306 and the electro optical layer 304 and thus the electric field is directly applied across the electro optical layer 304 and no electric field is applied across the multi reflective layers 306. Thus, with a lower amount of voltage the same phase change produced by the electro optical device 301 may be obtained.

FIG. 5B shows an electro optical device 550 that is consistent with the electro optical device 301 of FIG. 3A with the difference that the electro optical device 550 does not include an electro optical layer 304 between the second conductive layer 302 and the multi reflective layers 306. However, the multi reflective layers 306 of the electro optical device 550, as shown in FIG. 5C, includes alternating reflective layers 305 and electro optical layers 303. In some embodiments, the electro optical layers 303 are at least partially reflective to the incident EUV radiation beam 31. In some embodiments, the electro optical layers 303 are essentially transparent to the incident EUV radiation beam 31, however, about 10 to 75 percent of the incident EUV radiation beam 31 is reflected from the interface between the reflective layers 305 and the electro optical layers 303 when the incident EUV radiation beam 31 enters the interface from the reflective layer 305. The electric field is applied across the multi reflective layers 306 and, thus, the electric field is applied through multiple the electro optical layers 303 and changes the refractive index of multiple electro optical layers 303 and, thus, the phase change in the electro optical device 550 may become several times the phase change in the electro optical device 301 of FIG. 3A. Alternatively, the same phase change of the electro optical device 301 may be obtained with applying less amount of voltage.

Figure 6:
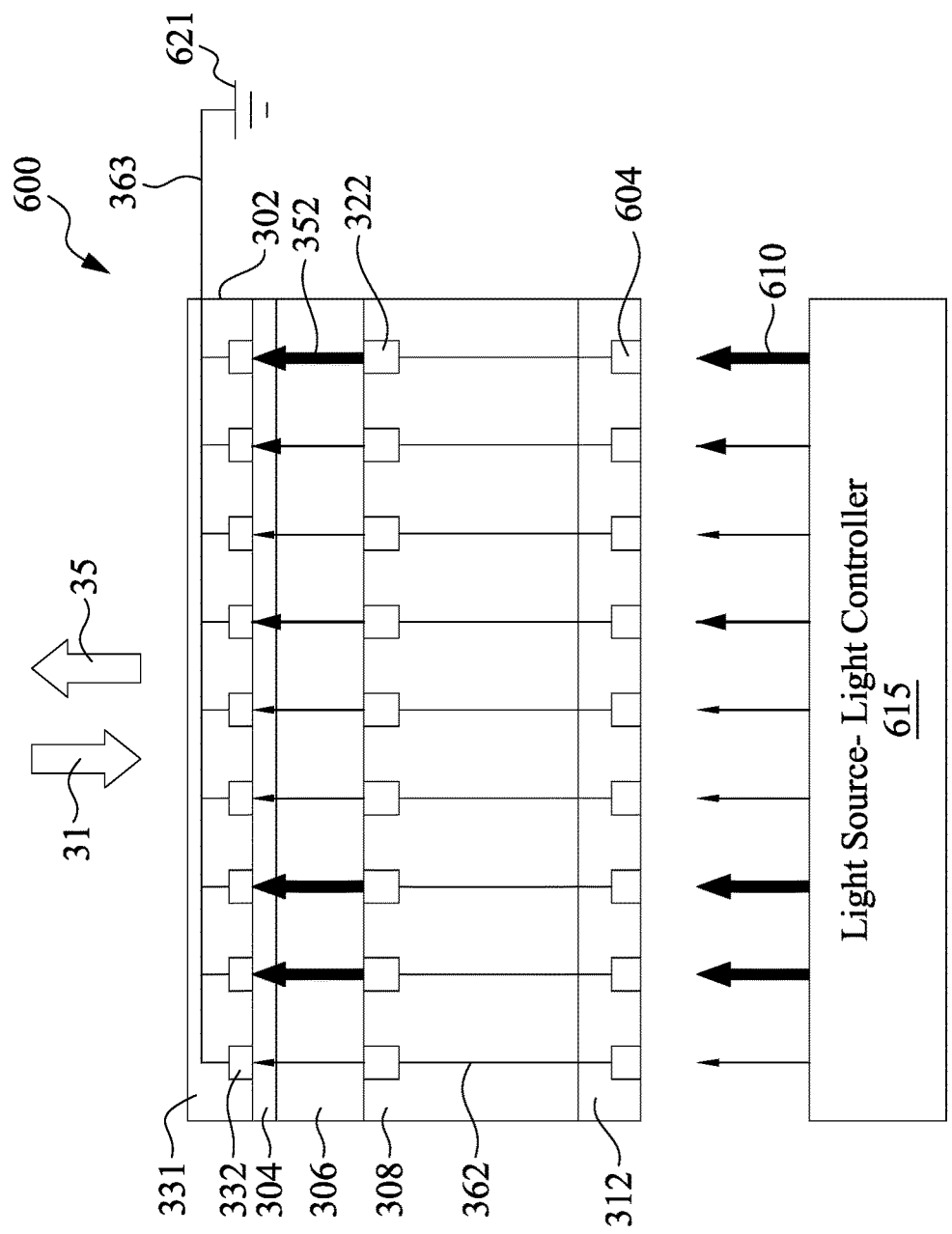
FIG. 6 shows a cross-sectional view of an electro optical device of an exposure device of a lithographic system in accordance with some embodiments of the present disclosure.

FIG. 6 shows a cross-sectional view of an electro optical device of an exposure device of a lithographic system in accordance with some embodiments of the present disclosure. An electro optical device 600 of FIG. 6 is consistent with the electro optical device of FIG. 4C with the difference that in the electro optical device 600, the electrical connection 363 is directly connected to a ground 621. In addition, the electro optical device 600 does not include the voltage generator-controller 350 and instead includes a light source-light controller 615 and the insulator layer 312 includes a plurality of light detectors 604 such that each light detector 604 is coupled to one conductive segment 322 via the electrical connections 362. As shown, the light source-light controller 615 directs a plurality of light beams 610 at the light detectors 604. In some embodiments, a thickness of the arrows of the light beams 610 shows the intensity of the light beams 610. The light detectors 604 detects the intensity of the light beams 610 and generates a voltage signal comparable with the intensity of the light beams 610. The generated voltage is applied via the electrical connections 362 to the conductive segments 322 and the electrical fields 352 are applied between the conductive segments 322 and the conductive segments 332 across the multi reflective layers 306 and the electro optical layer 304. As shown in FIG. 6, the intensity of the light beams 610 is consistent with the strength of the electric fields 352. Therefore, the light source-light controller 615 controls the phase change of the electro optical layer 304 by changing the intensity of the light beams 610. In some embodiments, the electro optical devices of FIGS. 4C and 3F are also modified and the plurality of light detectors 604 are disposed in the insulator layer 312 and the voltage generator-controller 350 is replaced with the light source-light controller 615 and the phase change of the electro optical devices of FIGS. 4C and 3F are controlled by light beams 610.

Figure 7D:
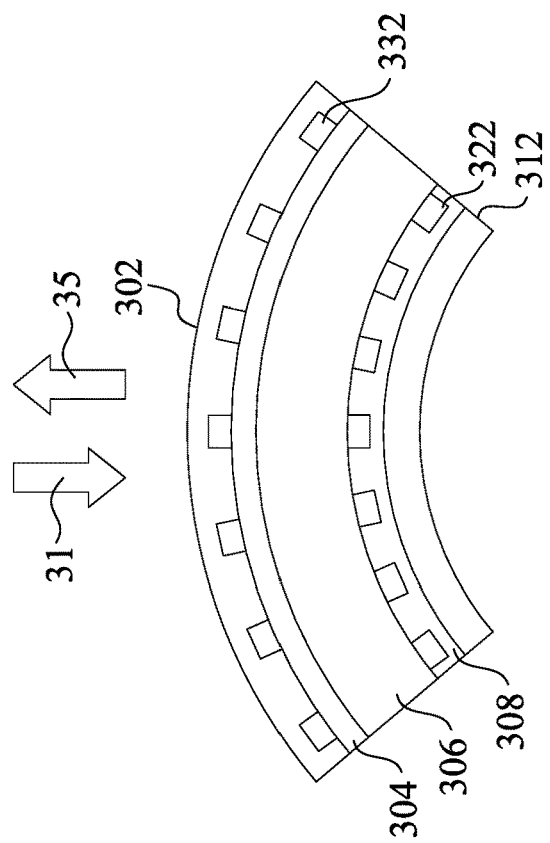

FIGS. 7A, 7B, 7C, and 7D show exposure devices and cross-sectional views of mirrors of the exposure devices of a lithographic system in accordance with some embodiments of the present disclosure. FIG. 7A is consistent with FIG. 2B and the light beams, e.g., the EUV radiation beam 29, is generated from an EUV radiation source, consistent with the EUV radiation source 100 of FIG. 2B. The EUV radiation beam 29 is directed by illumination optics, consistent with illumination optics 202 of FIG. 2B, to the photo mask 205. In response to the EUV radiation beam 29, the EUV radiation beam 31 is reflected from the layout patterns of the photo mask 205. After reflecting from the layout patterns of the photo mask 205, the EUV radiation beam 31 is directed by multiple mirrors 620A, 620B, 620C, 625A, 625B, and 620D to the wafer system 210 or the aberration detector 225. In some embodiments, one or more of the mirrors 620A, 620B, 620C, 625A, 625B, and 620D are flat mirrors, convex mirrors, or concave mirrors. In some embodiments, at least two of the mirrors, e.g., the mirrors 625A and 625B, include the one of electro optical devices of FIG. 3A, 3F, 4C, or 6. Thus, the incident EUV radiation beam 31 is reflected from the mirror 625A as the EUV radiation beam 35 where the EUV radiation beam 35 includes phase changes compared to the EUV radiation beam 31. In addition, the incident EUV radiation beam 35 is reflected from the mirror 625B as the EUV radiation 37 where the EUV radiation 37 includes phase changes compared to the EUV radiation beam 35. As shown, the aberration detector 225, e.g., an image detector, detects the reflected image from the mirror 620D and transfers the detected image to an analyzer module 230. In some embodiments, each of the mirrors 620A, 620B, 620C, 625A, 625B, and 620D include an electro optical device and concurrent with each other or in separate steps, the refractive index of the electro optical layers of the electro optical devices of the mirrors 620A, 620B, 620C, 625A, 625B, and 620D are adjusted, e.g., modified, based on the optical aberration of the exposure device.

The analyzer module 230 determines the optical aberration, e.g., the optical aberration error, of the detected image and determines phase corrections of the mirrors 625A and 625B to reduce the optical aberration error. Depending on the electro optical devices of mirror 625A and 625B being sensitive to the Pockels effect or the Kerr effect, the analyzer module 230 determines aberration correction voltages to be applied to the electro optical devices of the mirrors 625A and 625B to produce the determined phase corrections. In some embodiments, the voltage generator-controller 350 receives the determined voltages from the analyzer module 230 and applies the determined voltages to the electro optical devices of the mirrors 625A and 625B. In some embodiments, determining the phase corrections is applied iteratively such that after applying the determined aberration correction voltages, the aberration detector 225 detects the reflected image from the mirror 620D and transfers the detected image to the analyzer module 230. The analyzer module 230 re-determines the aberration error of the detected image and re-determines phase corrections of the mirrors 625A and 625B to reduce the aberration error, e.g., the optical aberration error. The analyzer module 230 re-determines aberration correction voltages to be applied to the electro optical devices of the mirrors 625A and 625B to produce the determined phase corrections. In some iterative procedure continues until the aberration error is reduced below a predetermined threshold value. In some embodiments, the aberration error is a percentage difference between the squared value of the difference between the detected image by the aberration detector 225 and a target pattern of the photo mask 205. In some embodiments, the difference is determined between the detected image by the aberration detector 225 and a grey scale image produced from dark color (e.g., black color) portions and bright color (e.g., white color) portions of the target pattern of the photo mask 205. In some embodiments, the threshold value is between about 0.1 percent and about 3 percent. In some embodiments, one or more of the electro optical devices 301, 400, 500, 550, or 600 are disposed over a surface of one or more of the mirrors of FIGS. 7A and 7B, e.g., the mirrors 625A and 625B. In some embodiments, the multi reflective layers 306 of the electro optical devices 301, 400, 500, 550, or 600 provide the reflective surface of one or more of the mirrors of FIGS. 7A and 7B, e.g., the mirrors 625A and 625B. In some embodiments, the CD uniformity is a measure of the aberration error, for example, the CD uniformity of a 3 nm CD is defined as the aberration error. In some embodiments, threshold value is 1 percent such that the threshold value is satisfied when the CD uniformity of the 3 nm CD in the detected image by the aberration detector 225 is better than 1 percent.

FIG. 7B is consistent with FIG. 7A having multiple mirrors 620 and with the difference that FIG. 7B has one mirror, e.g., mirror 625A, that has the electro optical device. Depending on the electro optical device of mirror 625A being sensitive to the Pockels effect or the Kerr effect, the analyzer module 230 determines aberration correction voltages to be applied to the electro optical device of the mirror 625A to produce the determined phase corrections. In some embodiments, the voltage generator-controller 350 receives the determined voltages from the analyzer module 230 and applies the determined voltages to the electro optical devices of the mirror 625A. In some embodiments, determining the phase corrections is applied iteratively as described above. In some embodiments, one or more of the mirrors of FIGS. 7A and 7B generate an imperfect wavefront such that the imperfect wavefront may cause defects to be produced on the wafer system 210. The phase corrections may restore the wavefront generated by the mirrors of FIGS. 7A and 7B and may remedy the defects on the wafer system 210.

Figure 7C:
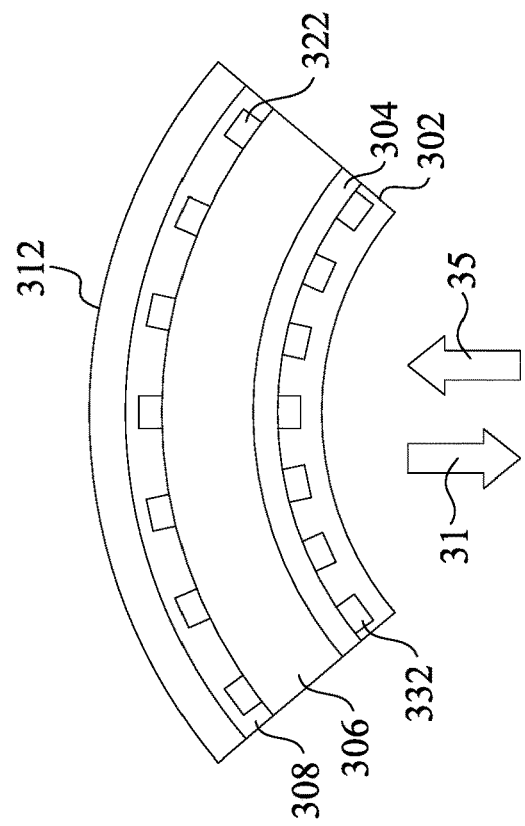

FIGS. 7C and 7D show the cross-sectional view of the mirrors, e.g., mirror 625A or mirror 625B of the exposure device of FIGS. 7A and 7B. The cross-sectional views of FIGS. 7C and 7D are consistent with the cross-sectional view of FIG. 3E with the difference that the mirror of FIG. 3E is a flat mirror, however, the mirror in FIG. 7C is convex mirror and the mirror in FIG. 7D is a concave mirror.

Figure 8:
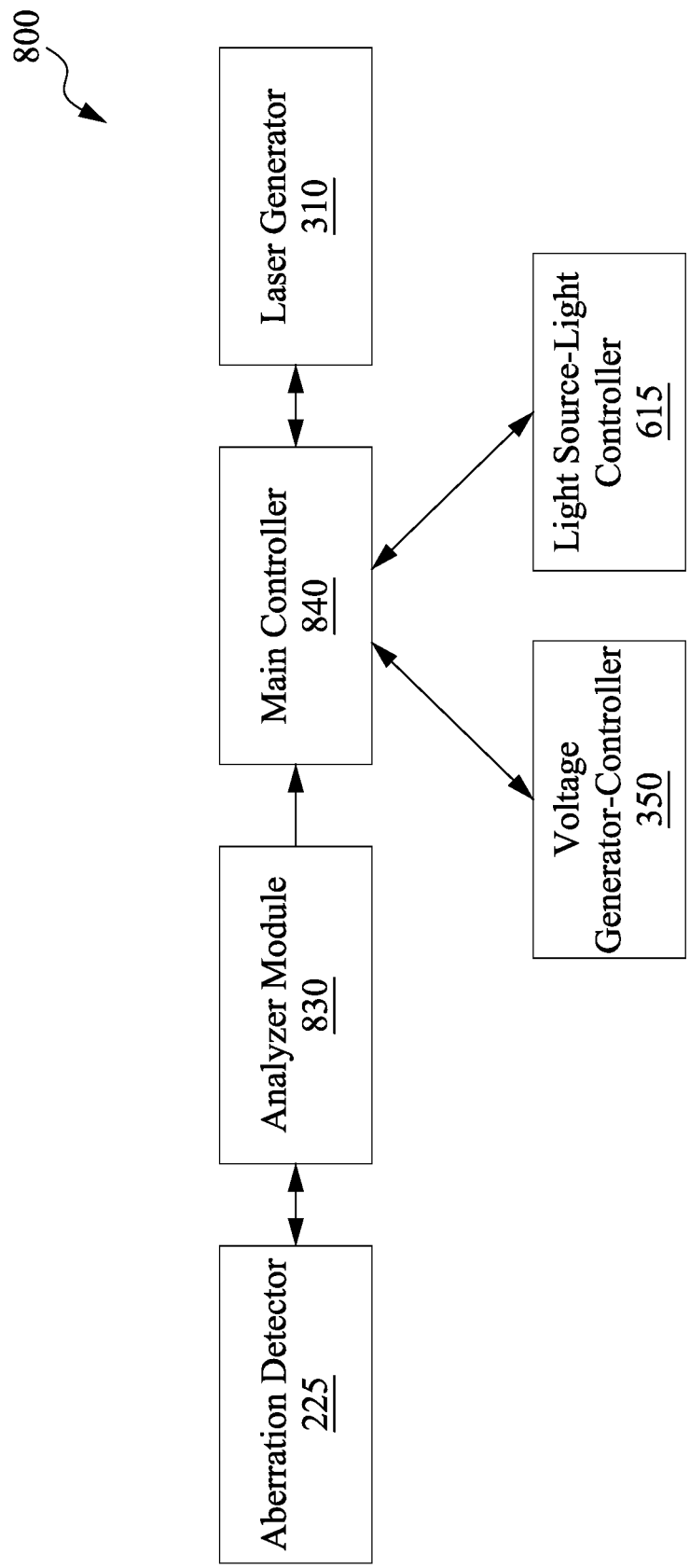
FIG. 8 shows a control system for compensating optical aberration of a lithographic system in accordance with some embodiments of the present disclosure.

FIG. 8 shows a control system 800 for compensating optical aberration of a lithographic system in accordance with some embodiments of the present disclosure. The control system 800 includes an analyzer module 830, which is consistent with the analyzer module 230 of FIGS. 2A and 2B and a main controller 840 coupled to each other. In some embodiments, the control system 800 includes the voltage generator-controller 350 of FIGS. 3F, the laser generator 310 of FIG. 1, and the light source-light controller 615 of FIG. 6. In some embodiments, the control system 800 includes the aberration detector 225 of FIGS. 2A and 2B that is coupled to the analyzer module 830.

In some embodiments and referring to FIGS. 2A and 2B, the main controller 840 commands the analyzer module 830 to receive the captured image of the layout patterns of the photo mask 205 and determine the CD uniformity of the captured image of the layout patterns of the photo mask 205 and compare it with the predetermined threshold CD uniformity. In some embodiments, the main controller 840 commands the analyzer module 830 to determine if bridging or pinching exists in the captured image of the layout patterns of the photo mask 205. In some embodiments, the main controller 840 commands the laser generator 310 to begin sending the excitation pulse and generating the EUV radiation beam 29 such that the aberration detector 225 receives the image of the layout patterns of the photo mask 205. In some embodiments, the main controller 840 commands the voltage generator-controller 350 to apply a set of voltages to a surface of one or more mirrors of the exposure device 200 as shown in FIG. 3F to modify the phase and/or amplitude of the reflected EUV radiation from the one or more mirrors. In some embodiments, the main controller 840 commands the light source-light controller 615 to transmit an intensity pattern to a back surface of one or more of the mirrors of the exposure device 200 as shown in FIG. 6 to modify the phase and/or amplitude of the reflected EUV radiation from the one or more mirrors. In some embodiments, the captured image of the layout patterns is divided into different zones and the CD uniformity and/or the number of pinching and bridging, and therefore the optical aberration, is measured for each zone separately.

Figure 9:
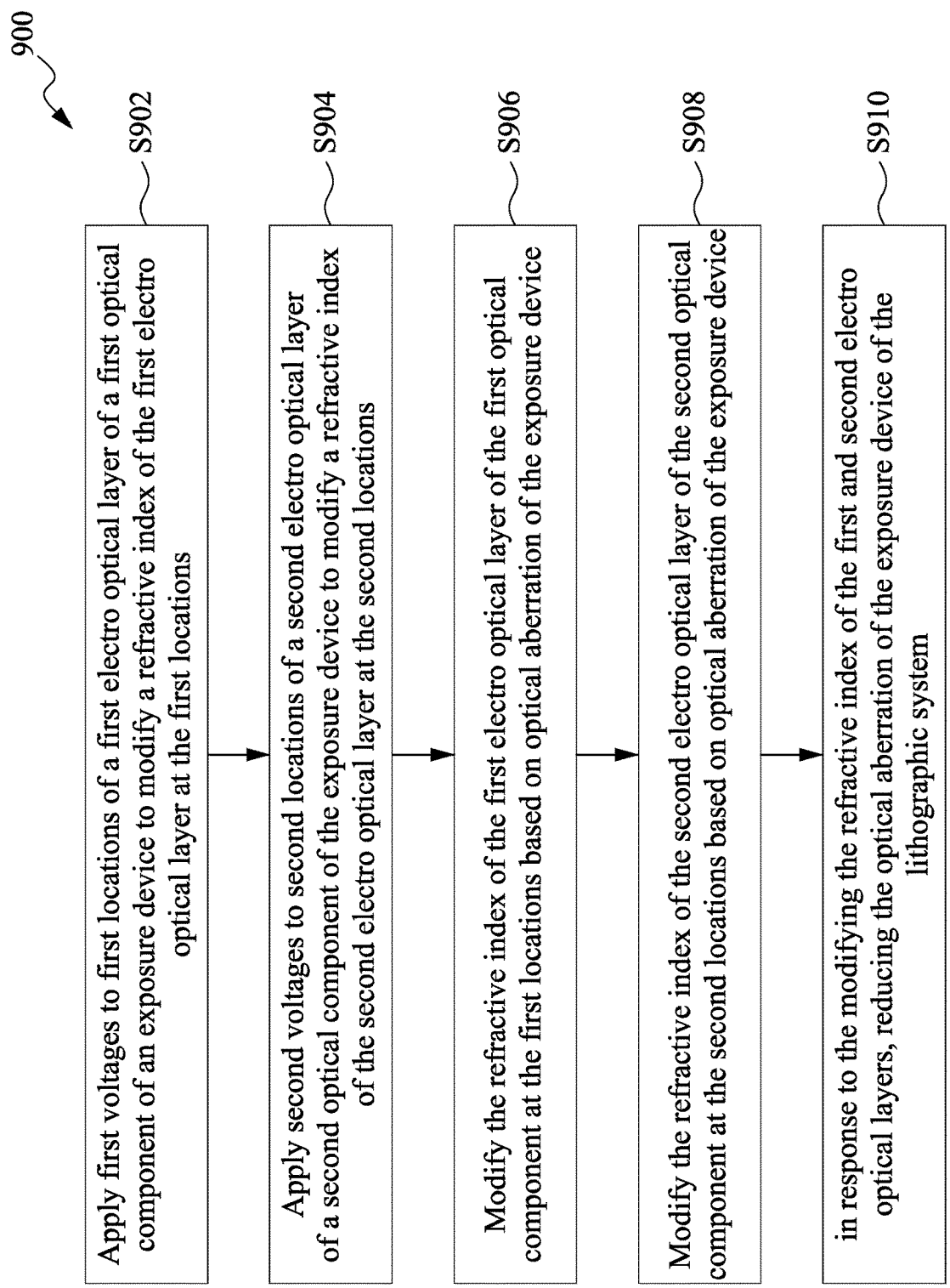
FIG. 9 shows a flow diagram of a process for compensating optical aberration of a lithographic system in accordance with some embodiments of the present disclosure.

FIG. 9 illustrates a flow diagram of a process 900 for compensating optical aberration of a lithographic system in accordance with some embodiments of the present disclosure. The process 900 or a portion of the process 900 may be performed by the systems of FIGS. 7A and 7B. In some embodiments, the process 900 or a portion of the process 900 is performed and/or is controlled by the computer system 1000 described below with respect to FIGS. 10A and 10B. In some embodiments, the process 900 or a portion of the process 900 is performed by the control system 800 of FIG. 8 described above. The method includes an operation S902, where first voltages are applied to first locations of a first electro optical layer of a first optical component of an exposure device to modify a refractive index of the first electro optical layer at the first locations. In some embodiments, the first voltages are applied to the electro optical layer 304 of the electro optical device 301 of FIG. 3A. As shown in FIG. 3F, a set of first voltages are generated and applied by the voltage generator-controller 350 to conductive segments 322 that are coupled via the multi reflective layers 306 to the electro optical layer 304. The application of the set of first voltages modifies the refractive index of the electro optical layer 304 at and around the location of the conductive segments 322 based on an amount of the applied first voltages and, thus, modifies a phase and/or amplitude of the reflected EUV radiation at and around the location of the conductive segments 322. In operation S904, second voltages are applied to second locations of a second electro optical layer of a second optical component of the exposure device to modify a refractive index of the second electro optical layer at the second locations. In some embodiments, the second voltages are applied to the electro optical layer 304 of the electro optical device 400 of FIG. 4A. As shown in FIG. 4C, a set of second voltages are generated and applied by the voltage generator-controller 350 to conductive segments 322 that are coupled via the multi reflective layers 306 to the electro optical layer 304. The application of the set of second voltages modifies the refractive index of the electro optical layer 304 at and around the location of the conductive segments 322 based on an amount of the applied second voltages and, thus, modifies a phase and/or amplitude of the reflected EUV radiation at and around the location of the conductive segments 322.

In operation S906, the refractive index of the first electro optical layer of the first electro optical device of the first optical component at the first locations is modified based on optical aberration of the exposure device. In operation S908, the refractive index of the second electro optical layer of the second electro optical device of the second optical component at the second locations is modified based on optical aberration of the exposure device. In some embodiments, as shown in FIG. 7A, the optical aberration of the exposure device 200 is measured by the analyzer module 230. The measured optical aberration is sent from the analyzer module 230 to the voltage generator-controller 350 to determine the set of first voltages and the set of second voltages based on the measured optical aberration. In operation S910, in response to the modifying the refractive index of the first and second electro optical layers, the optical aberration of the exposure device is reduced. In some embodiments, as shown in FIG. 7A, the first optical component is the mirror 625A and the second optical component is the mirror 625B. Thus, by setting the set of first voltages for the mirror 625A and by setting the set of second voltages for the mirror 625B, the optical aberration as determined by the analyzer module 230 is reduced.

In some embodiments, the optical aberration of FIG. 7A is iteratively and interactively reduced in the following steps. The set of first voltages and the set of second voltages are selected and set for the respective mirrors 625A and 625B. The optical aberration is measured by the aberration detector 225 and the analyzer module 230. The set of first voltages and the set of second voltages are modified based on the measured optical aberration until the optical aberration is reduced below a threshold or the optical aberration is minimized. In some embodiments, each of the first and second voltages are separately modified to minimize the optical aberration.

Figure 10A:
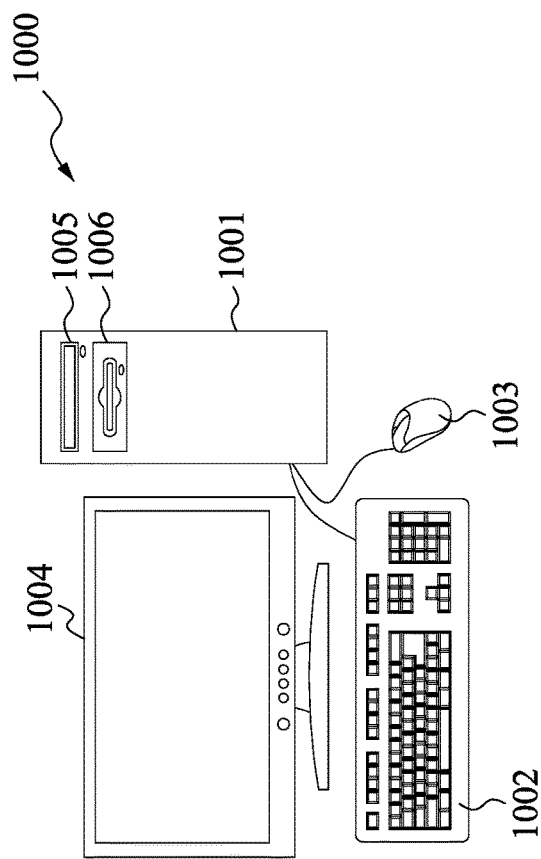
FIGS. 10A and 10B illustrate an apparatus for compensating optical aberration of an exposure device of a lithographic system in accordance with some embodiments of the present disclosure.
Figure 10B:
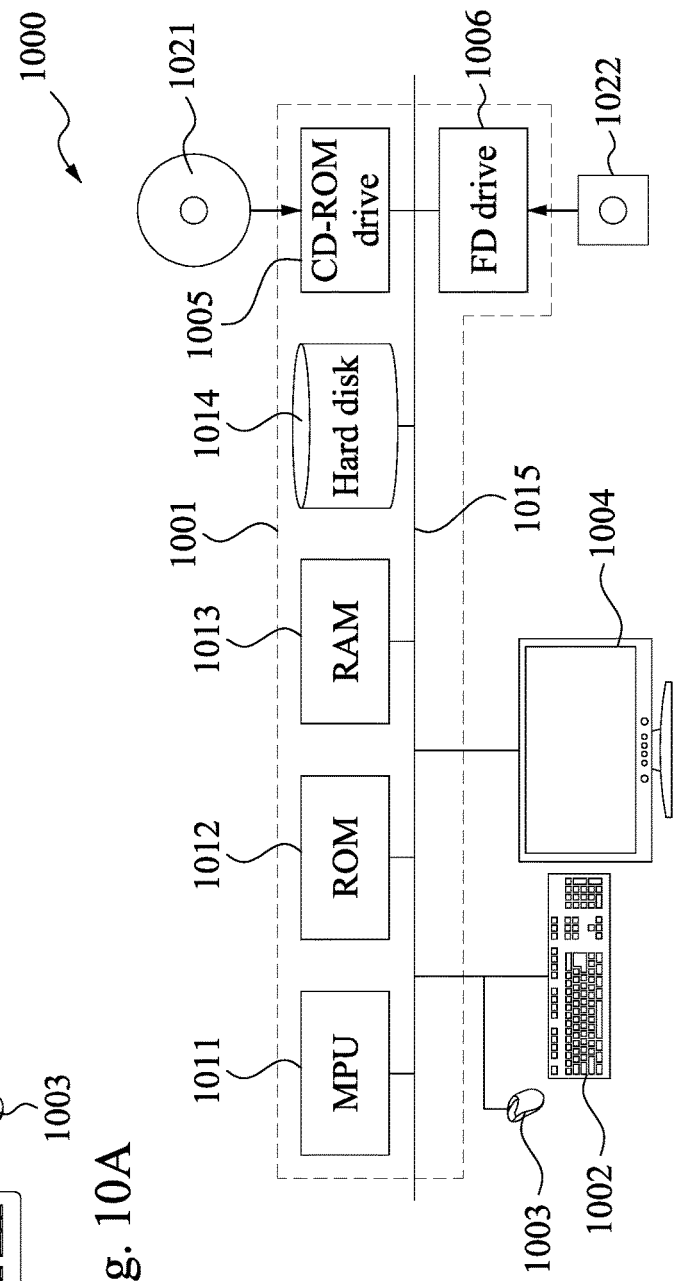

FIGS. 10A and 10B illustrate an apparatus for compensating the optical aberration of the exposure device of the lithographic system of FIG. 7A or 7B in accordance with some embodiments of the present disclosure. In some embodiments, the computer system 1000 is used for performing the functions of the modules of FIG. 8 that include the main controller 840, the analyzer module 830, the voltage generator-controller 350, and the light source-light controller 615. In some embodiments, the computer system 1000 is used to execute the process 900 of FIG. 9.

FIG. 10A is a schematic view of a computer system that performs the functions of an apparatus for compensating the optical aberration of the exposure device of the lithographic system. All of or a part of the processes, method and/or operations of the foregoing embodiments can be realized using computer hardware and computer programs executed thereon. In FIG. 10A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 10B is a diagram showing an internal configuration of the computer system 1000. In FIG. 10B, the computer 1001 is provided with, in addition to the optical disk drive 1005 and the magnetic disk drive 1006, one or more processors, such as a micro processing unit (MPU) 1011, a ROM 1012 in which a program such as a boot up program is stored, a random access memory (RAM) 1013 that is connected to the MPU 1011 and in which a command of an application program is temporarily stored and a temporary storage area is provided, a hard disk 1014 in which an application program, a system program, and data are stored, and a bus 1015 that connects the MPU 1011, the ROM 1012, and the like. Note that the computer 1001 may include a network card (not shown) for providing connection to a LAN.

The program for causing the computer system 1000 to execute the functions for compensating the optical aberration of the exposure device of the lithographic system in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 1001 to execute the functions of the control system for compensating the optical aberration of the exposure device of the lithographic system in the foregoing embodiments. The program may only include a command portion to call an appropriate function (module) in a controlled mode and obtain desired results.

Figure 11:
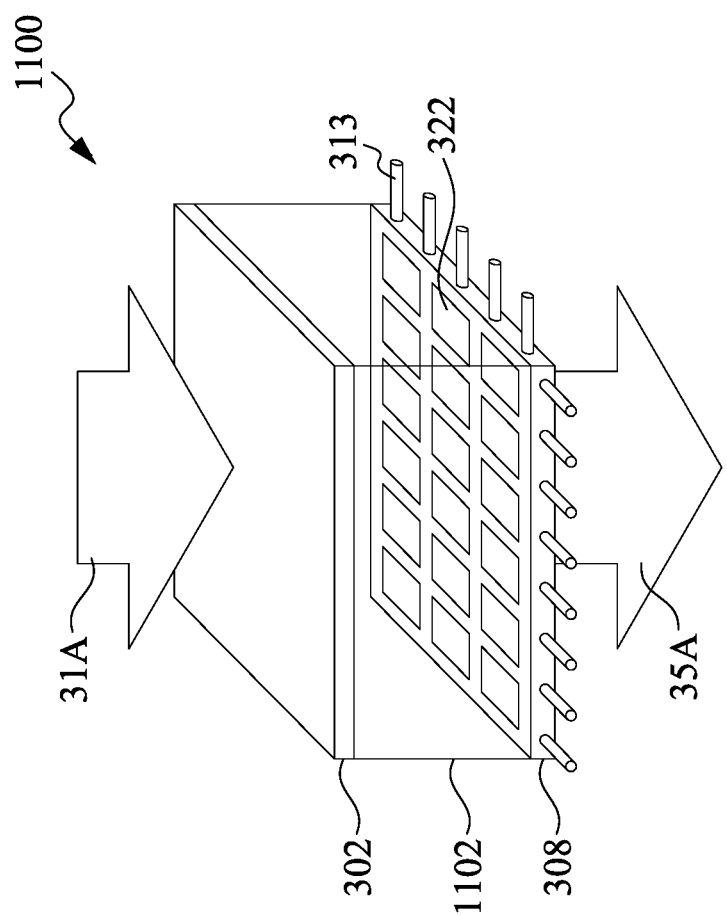
FIG. 11 shows an electro-optical component of an optical device of an exposure device of a lithographic system in accordance with some embodiments of the present disclosure.

FIG. 11 shows an electro-optical component of an optical device 1100 of an exposure device of a lithographic system in accordance with some embodiments of the present disclosure. As shown in FIG. 11, the layer 1102 is consistent with the projection optics 204 of FIG. 2A and as shown, a radiation beam 31A enters the layer 1102 and a radiation beam 35A exits the layer 1102. In addition, the layer 1102 is either an electro optical layer or includes at least one electro optical layer. In some embodiments, a set of multiple voltages is applied at multiple locations to the layer 1102 between the first conductive layer 308, e.g., the anode, and the second conductive layer 302, the cathode, as discussed above with respect to FIGS. 3A, 4A, and 5A. In some embodiments, the layer 1102 performs as a converging lens and by applying the set of voltages, via electrodes 313 and through conductive segments 322, the refractive index of the lens changes at multiple locations based on the applied voltages. Thus, the layer 1102 adds different phases based on the applied set of voltages to the radiation beam 35A that exits the layer 1102. As discussed, the lithography system may use a radiation source, e.g., a light source, that has a wavelength in the UV wavelength range, in the DUV wavelength range, in the EUV wavelength range, or in another wavelength range useful for lithography. Therefore, the radiation beams 31A and 35A are radiation beams having a wavelength in the above wavelength ranges.

According to some embodiments of the present disclosure, a mirror structure of an optical system of a lithographic system includes an insulator layer and a first conductive layer disposed on the insulator layer. The first conductive layer includes a first non-conductive film disposed on the insulator layer. The first non-conductive film includes one or more first conductive segments. The mirror structure also includes a reflective layer disposed on the first conductive layer and an electro optical layer disposed on the reflective layer. The mirror structure also includes a second conductive layer disposed on the electro optical layer. The second conductive layer includes a second non-conductive film disposed on the electro optical layer. The second non-conductive film includes one or more second conductive segments. In an embodiment, a refractive index of the electro optical layer is sensitive to an electric field applied across the electro optical layer and the mirror structure further includes a voltage generator-controller that is coupled between the one or more first conductive segments and the one or more second conductive segments. The voltage generator-controller applies a voltage between the one or more first conductive segments and the one or more second conductive segments to induce an electric field across the electro optical layer. In an embodiment, the voltage generator-controller applies a plurality of voltage differences between each pair of the one or more first conductive segments and the one or more second conductive segments to induce different electric fields across different locations of the electro optical layer. In an embodiment, the one or more first conductive segments are disjoint segments that are distributed on a surface of the first conductive layer that is in contact with the reflective layer, and the one or more second conductive segments are disjoint segments that are distributed on a surface of the second conductive layer that is in contact with the electro optical layer. In an embodiment, the mirror structure further includes one or more pairs including an electro optical layer disposed on a reflective layer that are disposed between the first conductive layer and the second conductive layer. In an embodiment, the reflective layer includes a plurality of film pairs. Between about 10 to 75 percent of a light beam vertically incident on an interface between each two film pairs is reflected. In an embodiment, a wavelength of the light beam is either in ultraviolet (UV) wavelength range between 300 nm and 400 nm, in deep UV wavelength range between 150 nm and 290 nm, or in extreme UV wavelength range between 10 nm and 100 nm.

According to some embodiments of the present disclosure, a method of compensating optical aberration of a lithographic system includes applying one or more first voltages to one or more first locations of a first electro optical layer of a first electro optical device of a first optical component of the exposure device of the lithographic system to modify a refractive index of the first electro optical layer at the first one or more locations. The method also includes applying one or more second voltages to one or more second locations of a second electro optical layer of a second electro optical device of a second optical component of the exposure device of the lithographic system to modify a refractive index of the second electro optical layer at the second one or more locations. The method also includes modifying the refractive index of the first electro optical layer of the first electro optical device at the first one or more locations based on optical aberration of the exposure device. The method includes modifying the refractive index of the second electro optical layer of the second electro optical device at the second one or more locations based on optical aberration of the exposure device and in response to the modifying the refractive index of the first and second electro optical layers, reducing the optical aberration of the exposure device of the lithographic system. In an embodiment, the optical aberration is detected at a wavelength in extreme ultraviolet wavelength range between 10 nm and 100 nm. In an embodiment, the method further includes prior to the applying the one or more first voltages to one or more first locations of the first electro optical layer and prior to the applying the one or more second voltages to one or more second locations of the second electro optical layer, detecting the optical aberration of the exposure device of the lithographic system at an exit pupil of the exposure device. In an embodiment, the first optical component is a convex mirror and the second optical component is a concave mirror. The first and second optical components are used for imaging a reticle onto a photo resist layer of a wafer. In an embodiment, the first electro optical device is disposed over a reflective surface of the convex mirror and the second electro optical device is disposed over a reflective surface of the concave mirror, the method further includes projecting, by a radiation beam of a radiation source, through the exposure device of the lithographic system, a layout pattern of a reticle onto a photo resist layer of a wafer, modifying the refractive index of the first electro optical layer at the one or more first locations of the first electro optical layer of the first electro optical device to modify a phase of a reflected radiation beam at the one or more first locations, and modifying the refractive index of the second electro optical layer at the one or more second locations of the second electro optical layer of the second electro optical device to modify a phase of a reflected radiation beam at the one or more second locations. In an embodiment, a third electro optical device is disposed over the reflective surface of a second concave mirror, the method further includes applying one or more third voltages to one or more third locations of a third electro optical layer of the third electro optical device of the second concave mirror to modify an amplitude of a reflected radiation beam at the one or more third locations. In an embodiment, the method further includes after modifying the refractive index of the first and second electro optical layers, continue monitoring the optical aberration of the exposure device of the lithographic system at the exit pupil of the exposure device, and continue modifying the refractive index of the first and second electro optical layers until an optical aberration error is reduced is reduced below a threshold value of 1 percent.

According to some embodiments of the present disclosure, a method of compensating optical aberration of a lithographic system includes applying one or more first voltages to one or more first locations of a first electro optical layer of a first electro optical device of a first mirror of an exposure device of a lithographic system to modify a refractive index of the first electro optical layer at the first one or more locations. The method includes monitoring optical aberration of the exposure device of the lithographic system at an exit pupil of the exposure device. The method also includes adjusting the refractive index of the first electro optical layer of the first electro optical device at the first one or more locations based on optical aberration of the exposure device. The method further includes in response to the adjusting the refractive index of the first electro optical layer, reducing the optical aberration of the exposure device of the lithographic system. In an embodiment, the method further includes applying the one or more first voltages across a thickness of the first electro optical layer at the one or more first locations. The one or more first voltages are applied to a first side of the first electro optical layer and a ground voltage is applied to a second side, opposite to the first side, of the first electro optical layer. In an embodiment, a material of the first electro optical layer comprises a nonlinear material with a refractive index that is sensitive to electric field, and wherein the non-linear material includes one of $LiNbO_3$ or $SiO_2$. In an embodiment, the method further includes applying one or more second voltages to one or more second locations of a second electro optical layer of a second electro optical device of a second mirror of the exposure device of the lithographic system to modify a refractive index of the second electro optical layer at the second one or more locations; adjusting the refractive index of the second electro optical layer of the second electro optical device at the second one or more locations based on optical aberration of the exposure device; and in response to the adjusting the refractive index of the second electro optical layer, further reducing the optical aberration of the exposure device of the lithographic system. In an embodiment, the method further includes applying one or more third voltages to one or more third locations of a third electro optical layer of a third electro optical device of a third mirror of the exposure device of the lithographic system to modify a refractive index of the third electro optical layer at the third one or more locations; adjusting the refractive index of the third electro optical layer of the third electro optical device at the third one or more locations based on optical aberration of the exposure device; and in response to the adjusting the refractive index of the third electro optical layer, further reducing the optical aberration of the exposure device of the lithographic system. In an embodiment, the method further includes reducing the optical aberration of the exposure device of the lithographic system below a threshold value by iteratively performing the steps of: monitoring optical aberration of the exposure device of the lithographic system at an exit pupil of the exposure device; and adjusting the refractive index of one or more of the first, second, and third electro optical layer of the first, second, and third electro optical device based on the optical aberration of the exposure device.

As described in the foregoing embodiments, the radiation source or the exposure device of the lithographic system may cause optical aberration. Therefore, applying electro-optical effects that are controlled by application of a voltage to optical components of the exposure device can modify the phase and/or the amplitude of the radiation beam and, thus, compensate for the optical aberration. The method avoids applying stress or heat that may cause damage to the mirrors.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mirror structure comprising:
   an insulator layer;
   a first conductive layer disposed on the insulator layer, wherein the first conductive layer comprises a first non-conductive film disposed on the insulator layer, wherein the first conductive layer comprises a plurality of first conductive segments arranged in a two-dimensional matrix and disconnected from each other by the first non-conductive film, and wherein the first conductive layer comprises an upper surface and a lower surface opposite the upper surface;
   a reflective layer disposed on the first conductive layer;
   an electro optical layer disposed on the reflective layer;
   a second conductive layer disposed on the electro optical layer, wherein the second conductive layer comprises a second non-conductive film disposed on the electro optical layer, wherein the second conductive layer comprises one or more second conductive segments; and
   a plurality of electrodes coupled to the plurality of first conductive segments, respectively, and horizontally extending outwardly away from a plurality of outermost sides of the first conductive layer between the upper surface and the lower surface of the first conductive layer.

2. The mirror structure of claim 1, further comprising:
   a voltage generator-controller that is coupled between the plurality of first conductive segments and the one or more second conductive segments,
   wherein the voltage generator-controller is configured to apply a voltage between the plurality of first conductive segments and the one or more second conductive segments to induce an electric field across the electro optical layer.

3. The mirror structure of claim 2, wherein:
   the second conductive layer comprises a plurality of second conductive segments arranged in a two-dimensional matrix and disconnected from each other by the second non-conductive film, and
   the voltage generator-controller is configured to apply a plurality of voltage differences between each pair of the plurality of first conductive segments and the plurality of second conductive segments to induce different electric fields across different locations of the electro optical layer.

4. The mirror structure of claim 3, wherein:
   the plurality of first conductive segments are distributed on a surface of the first conductive layer that is in contact with the reflective layer, and
   the plurality of second conductive segments are distributed on a surface of the second conductive layer that is in contact with the electro optical layer.

5. The mirror structure of claim 1, further comprising one or more pairs of an electro optical layer disposed on a reflective layer that are disposed between the first conductive layer and the second conductive layer.

6. The mirror structure of claim 1, wherein:
   the reflective layer comprises a plurality of film pairs, and
   between about 10 to 75 percent of a light beam vertically incident on an interface between each two film pairs is reflected.

7. The mirror structure of claim 1, wherein a refractive index of the electro optical layer is sensitive to an electric field applied across the electro optical layer.

8. A method comprising:
   applying one or more first voltages to one or more first locations of a first electro optical layer of a first electro optical device of a first optical component of an exposure device of a lithographic system to modify a refractive index of the first electro optical layer at the first one or more locations;
   applying one or more second voltages to one or more second locations of a second electro optical layer of a second electro optical device of a second optical component of the exposure device of the lithographic system to modify a refractive index of the second electro optical layer at the second one or more locations;
   modifying the refractive index of the first electro optical layer of the first electro optical device at the first one or more locations based on optical aberration of the exposure device;
   modifying the refractive index of the second electro optical layer of the second electro optical device at the second one or more locations based on the optical aberration of the exposure device; and
   in response to the modifying the refractive index of the first and second electro optical layers, reducing the optical aberration of the exposure device of the lithographic system.

9. The method of claim 8, wherein the optical aberration is detected at a wavelength in extreme ultraviolet wavelength range between 10 nm and 100 nm.

10. The method of claim 8, further comprising:
    prior to the applying the one or more first voltages to one or more first locations of the first electro optical layer and prior to the applying the one or more second voltages to one or more second locations of the second electro optical layer, detecting the optical aberration of the exposure device of the lithographic system at an exit pupil of the exposure device.

11. The method of claim 10, further comprising:
    after modifying the refractive index of the first and second electro optical layers, continue monitoring the optical aberration of the exposure device of the lithographic system at the exit pupil of the exposure device; and
    continue modifying the refractive index of the first and second electro optical layers until an optical aberration error is reduced below a threshold value of 1 percent.

12. The method of claim 8, wherein the first optical component is a convex mirror and the second optical component is a concave mirror, wherein the first and second optical components are used for imaging a reticle onto a photo resist layer of a wafer.

13. The method of claim 12, wherein the first electro optical device is disposed over a reflective surface of the convex mirror and the second electro optical device is disposed over a reflective surface of the concave mirror, the method further comprising:
- projecting, by a radiation beam of a radiation source, through the exposure device of the lithographic system, a layout pattern of a reticle onto a photo resist layer of a wafer;
- modifying the refractive index of the first electro optical layer at the one or more first locations of the first electro optical layer of the first electro optical device to modify a phase of a reflected radiation beam at the one or more first locations; and
- modifying the refractive index of the second electro optical layer at the one or more second locations of the second electro optical layer of the second electro optical device to modify a phase of a reflected radiation beam at the one or more second locations.

14. The method of claim 13, wherein a third electro optical device is disposed over the reflective surface of a second concave mirror, the method further comprising:
- applying one or more third voltages to one or more third locations of a third electro optical layer of the third electro optical device of the second concave mirror to modify an amplitude of a reflected radiation beam at the one or more third locations.

15. A method comprising:
- applying one or more first voltages to one or more first locations of a first electro optical layer of a first electro optical device of a first mirror of an exposure device of a lithographic system to modify a refractive index of the first electro optical layer at the first one or more locations;
- monitoring optical aberration of the exposure device of the lithographic system at an exit pupil of the exposure device;
- adjusting the refractive index of the first electro optical layer of the first electro optical device at the first one or more locations based on the optical aberration of the exposure device; and
- in response to the adjusting the refractive index of the first electro optical layer, reducing the optical aberration of the exposure device of the lithographic system.

16. The method of claim 15, further comprising:
- applying the one or more first voltages across a thickness of the first electro optical layer at the one or more first locations, wherein the one or more first voltages are applied to a first side of the first electro optical layer and a ground voltage is applied to a second side, opposite to the first side, of the first electro optical layer.

17. The method of claim 15, wherein a material of the first electro optical layer comprises a nonlinear material with a refractive index that is sensitive to electric field, and wherein the nonlinear material includes one of $LiNbO_3$ or $SiO_2$.

18. The method of claim 15, further comprising;
- applying one or more second voltages to one or more second locations of a second electro optical layer of a second electro optical device of a second mirror of the exposure device of the lithographic system to modify a refractive index of the second electro optical layer at the second one or more locations;
- adjusting the refractive index of the second electro optical layer of the second electro optical device at the second one or more locations based on the optical aberration of the exposure device; and
- in response to the adjusting the refractive index of the second electro optical layer, further reducing the optical aberration of the exposure device of the lithographic system.

19. The method of claim 18, further comprising:
- applying one or more third voltages to one or more third locations of a third electro optical layer of a third electro optical device of a third mirror of the exposure device of the lithographic system to modify a refractive index of the third electro optical layer at the third one or more locations; and
- adjusting the refractive index of the third electro optical layer of the third electro optical device at the third one or more locations based on the optical aberration of the exposure device; and
- in response to the adjusting the refractive index of the third electro optical layer, further reducing the optical aberration of the exposure device of the lithographic system.

20. The method of claim 19, further comprising:
- reducing the optical aberration of the exposure device of the lithographic system below a threshold value by iteratively performing the steps of:
- monitoring the optical aberration of the exposure device of the lithographic system at an exit pupil of the exposure device; and
- adjusting the refractive index of one or more of the first, second, and third electro optical layer of the first, second, and third electro optical device based on the optical aberration of the exposure device.

* * * * *